(12) United States Patent
Oh et al.

(10) Patent No.: US 9,287,270 B2
(45) Date of Patent: Mar. 15, 2016

(54) SEMICONDUCTOR DEVICE AND FABRICATING METHOD THEREOF

(71) Applicants: Jung-Hwan Oh, Yongin-si (KR); Hyun-Jun Kim, Seoul (KR); Jong-Bom Seo, Seoul (KR); Ki-Vin Im, Seongnam-si (KR); Han-Jin Lim, Seoul (KR)

(72) Inventors: Jung-Hwan Oh, Yongin-si (KR); Hyun-Jun Kim, Seoul (KR); Jong-Bom Seo, Seoul (KR); Ki-Vin Im, Seongnam-si (KR); Han-Jin Lim, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/279,301

(22) Filed: May 15, 2014

(65) Prior Publication Data

US 2015/0091069 A1  Apr. 2, 2015

(30) Foreign Application Priority Data

Oct. 2, 2013  (KR) .................. 10-2013-0117842

(51) Int. Cl.
*H01L 27/108* (2006.01)
*H01L 49/02* (2006.01)

(52) U.S. Cl.
CPC ...... *H01L 27/10805* (2013.01); *H01L 27/1085* (2013.01); *H01L 27/10808* (2013.01); *H01L 28/91* (2013.01)

(58) Field of Classification Search
CPC ............... H01L 27/0629; H01L 27/10817; H01L 27/10852; H01L 28/91; H01L 28/40
USPC .................. 257/300, 296; 438/381
See application file for complete search history.

(56) References Cited

U.S. PATENT DOCUMENTS

| | | | |
|---|---|---|---|
| 6,707,091 B2 | 3/2004 | Aihara | |
| 7,482,242 B2 | 1/2009 | Park et al. | |
| 7,750,385 B2 | 7/2010 | Chung et al. | |
| 2007/0045693 A1* | 3/2007 | Manning et al. | 257/296 |
| 2010/0159700 A1* | 6/2010 | Eun | 438/694 |
| 2011/0001175 A1* | 1/2011 | Jang | 257/296 |

FOREIGN PATENT DOCUMENTS

| | | |
|---|---|---|
| KR | 10-0402943 | 10/2003 |
| KR | 10-2004-0003967 A | 1/2004 |
| KR | 10-2005-0028387 A | 3/2005 |
| KR | 10-2007-0009285 A | 1/2007 |
| KR | 10-0796724 B1 | 1/2008 |
| KR | 10-0881828 | 2/2009 |

* cited by examiner

*Primary Examiner* — Lynne Gurley
*Assistant Examiner* — Tong-Ho Kim
(74) *Attorney, Agent, or Firm* — Muir Patent Law, PLLC

(57) ABSTRACT

Provided are a semiconductor device and a fabricating method thereof. The semiconductor device includes a storage electrode having a cylinder shape, a dielectric film formed on the storage electrode, and a plate electrode formed on the dielectric film, wherein the plate electrode includes a first semiconductor compound layer and a second semiconductor compound layer sequentially stacked one on the other, and the first semiconductor compound layer has a crystallinity different from that of the second semiconductor compound layer.

20 Claims, 21 Drawing Sheets

SEMICONDUCTOR DEVICE AND FABRICATING METHOD THEREOF

CROSS-REFERENCE TO RELATED APPLICATION

This application claims priority to Korean Patent Application No. 10-2013-0117842 filed on Oct. 2, 2013 in the Korean Intellectual Property Office, and all the benefits accruing therefrom under 35 U.S.C. 119, the contents of which in its entirety are herein incorporated by reference.

BACKGROUND

The present disclosure relates to a semiconductor device and a fabricating method thereof.

In order to increase the capacity of a capacitor, a wide variety of studies are being conducted. For example, the capacitance of a capacitor can be increased by increasing an aspect ratio of a storage electrode of the capacitor. The storage electrode may be shaped of, for example, a three dimensional cylinder. In addition, a high dielectric constant (high-k) film may be used as a dielectric film of the capacitor.

In a subsequent process performed after forming the capacitor, however, impurities, such as hydrogen ions, may penetrate into the dielectric film. In this case, the dielectric film may have deteriorated characteristics. For example, an error may be generated at a DRAM device employing the capacitor.

SUMMARY

The present disclosure provides a semiconductor device employing a capacitor having improved reliability.

The present disclosure also provides a fabricating method of a semiconductor device employing a capacitor having improved reliability.

These and other objects of the present disclosure will be described in or be apparent from the following description of the various embodiments.

According to one exemplary embodiment, a semiconductor device includes a substrate; a plurality of vertical cylindrical lower capacitor electrodes formed on the substrate, a dielectric layer formed on the plurality of vertical cylindrical lower capacitor electrodes, and an upper electrode formed on the plurality of vertical cylindrical lower capacitor electrodes and on the dielectric layer, such that the dielectric layer is between the upper electrode and the plurality of vertical cylindrical lower capacitor electrodes. Each vertical cylindrical lower capacitor electrode includes a horizontal bottom portion and a vertical portion extending upward from the horizontal bottom portion, first vertical cylindrical lower capacitor electrodes of the plurality of vertical cylindrical lower capacitor electrodes each include a full vertical portion that extends to a first height throughout the electrode, and second vertical cylindrical lower capacitor electrodes of the plurality of vertical cylindrical lower capacitor electrodes each include a full vertical portion that extends to the first height for part of the electrode and a shortened vertical portion that extends to a second height lower than the first height for part of the electrode. The upper electrode includes a first portion formed of a first material and that contacts the dielectric layer, a second portion formed of a second material different from the first material and that covers part of the first portion and covers shortened vertical portions of a plurality of the second vertical cylindrical lower capacitor electrodes, and a third portion formed of a third material different from the first material and that covers the first portion and the second portion. The second portion has a different composition from the third portion.

In one embodiment, the first portion of the upper electrode includes a metal; the second portion of the upper electrode comprises a first semiconductor compound layer; and the third portion of the upper electrode comprises a second semiconductor compound layer.

In one embodiment, the crystallinity of the first semiconductor compound layer is lower than that of the second semiconductor compound layer.

In one embodiment, the first semiconductor compound layer and the second semiconductor compound layer include a plurality of semiconductor elements, which are the same as each other, the first semiconductor compound layer and the second semiconductor compound layer having different composition ratios of those semiconductor elements.

A support structure may be disposed between adjacent full vertical portions of the plurality of vertical cylindrical lower capacitor electrodes. In on embodiment, the support structure is not disposed between adjacent shortened vertical portions of the plurality of vertical cylindrical lower capacitor electrodes.

In one embodiment, the plurality of vertical lower capacitor electrodes are formed in rows; and a first region of the semiconductor device includes two adjacent rows of second vertical cylindrical lower capacitor electrodes.

In the first region, shortened vertical portions of the second vertical cylindrical lower capacitor electrodes may face each other. Further, the second portion of the upper electrode may be formed in the first region and cover the shortened vertical portions of the second vertical cylindrical lower capacitor electrodes.

In one embodiment, a thickness of the dielectric film formed on a top surface of each of the first vertical cylindrical lower capacitor electrodes is greater than that of the dielectric film formed on sidewalls of the first vertical cylindrical lower capacitor electrodes.

The plurality of vertical cylindrical lower capacitor electrodes may be arranged in a hexagonal arrangement.

The plurality of vertical cylindrical lower capacitor electrodes and the upper electrode may form capacitors in a semiconductor memory device.

In one embodiment, a semiconductor device includes a substrate, a plurality of lower electrodes formed on the substrate, a dielectric layer formed on the plurality of lower electrodes, and an upper electrode formed on the plurality of lower electrodes and on the dielectric layer. Each lower electrode extends vertically upward away from the substrate, first lower electrodes of the plurality of lower electrodes include a bottom cylinder portion at a first height that has vertical walls on all sides and a top cylinder portion at a second height above the first height that also has vertical walls on all sides, and second lower electrodes of the plurality of lower electrodes include a bottom cylinder portion at the first height that has vertical walls on all sides and a top cylinder portion at the second height that has vertical walls on some sides but no walls on at least part of the top cylinder portion. The upper electrode includes a first semiconductor compound layer and a second semiconductor compound layer sequentially stacked one on the other, and the first semiconductor compound layer has a crystallinity different from that of the second semiconductor compound layer.

In one embodiment, the first semiconductor compound layer is formed above portions of the second lower electrodes having no walls on at part of the top cylinder portion; and the first semiconductor compound layer is formed between the second lower electrodes and the second semiconductor compound layer.

The upper electrode may further comprise a portion that includes a metal and is disposed to contact the dielectric layer.

The crystallinity of the first semiconductor compound layer may be lower than that of the second semiconductor compound layer.

In one embodiment, the lower electrodes and the upper electrode form capacitor electrodes in a semiconductor memory device.

According to certain embodiments, a semiconductor device includes a storage electrode having a cylinder shape, a dielectric film formed on the storage electrode, and a plate electrode formed on the dielectric film, wherein the plate electrode includes a first semiconductor compound layer and a second semiconductor compound layer sequentially stacked one on the other, and the first semiconductor compound layer has a crystallinity different from that of the second semiconductor compound layer.

According to another embodiment, a semiconductor device includes first storage electrodes and second storage electrodes adjacent to each other and having a cylinder shape, a supporter pattern formed between the first storage electrodes and the second storage electrodes, a dielectric film formed on the first storage electrodes and the second storage electrodes, a recess formed on a portion of a sidewall of each of the first storage electrodes, and an upper electrode formed on the dielectric film, wherein the upper electrode includes a first semiconductor compound layer formed in the recess and a second semiconductor compound layer formed on the first semiconductor compound layer, and the first semiconductor compound layer and the second semiconductor compound layer have different compositions.

According to still another embodiment, a semiconductor device includes a plurality of first storage electrodes formed in a first region, the first storage electrodes being vertical electrodes with portions of the sidewalls of the first storage electrodes being recessed, a plurality of second storage electrodes formed in a second region adjacent to the first region, the second storage electrodes being vertical electrodes, a supporter pattern formed between second storage electrodes of the plurality of second storage electrodes in the second region, a dielectric film formed on the plurality of first storage electrodes and the plurality of second storage electrodes, and a third electrode formed on the dielectric film, the third electrode covering the plurality of first storage electrodes and plurality of second storage electrodes, wherein the third electrode includes a first semiconductor compound layer and a second semiconductor compound layer sequentially stacked one on the other, and the first semiconductor compound layer and the second semiconductor compound layer have different crystallinities.

BRIEF DESCRIPTION OF THE DRAWINGS

The above and other features and advantages of the present disclosure will become more apparent by describing in detail various embodiments thereof with reference to the attached drawings in which.

DETAILED DESCRIPTION

Figure 1:
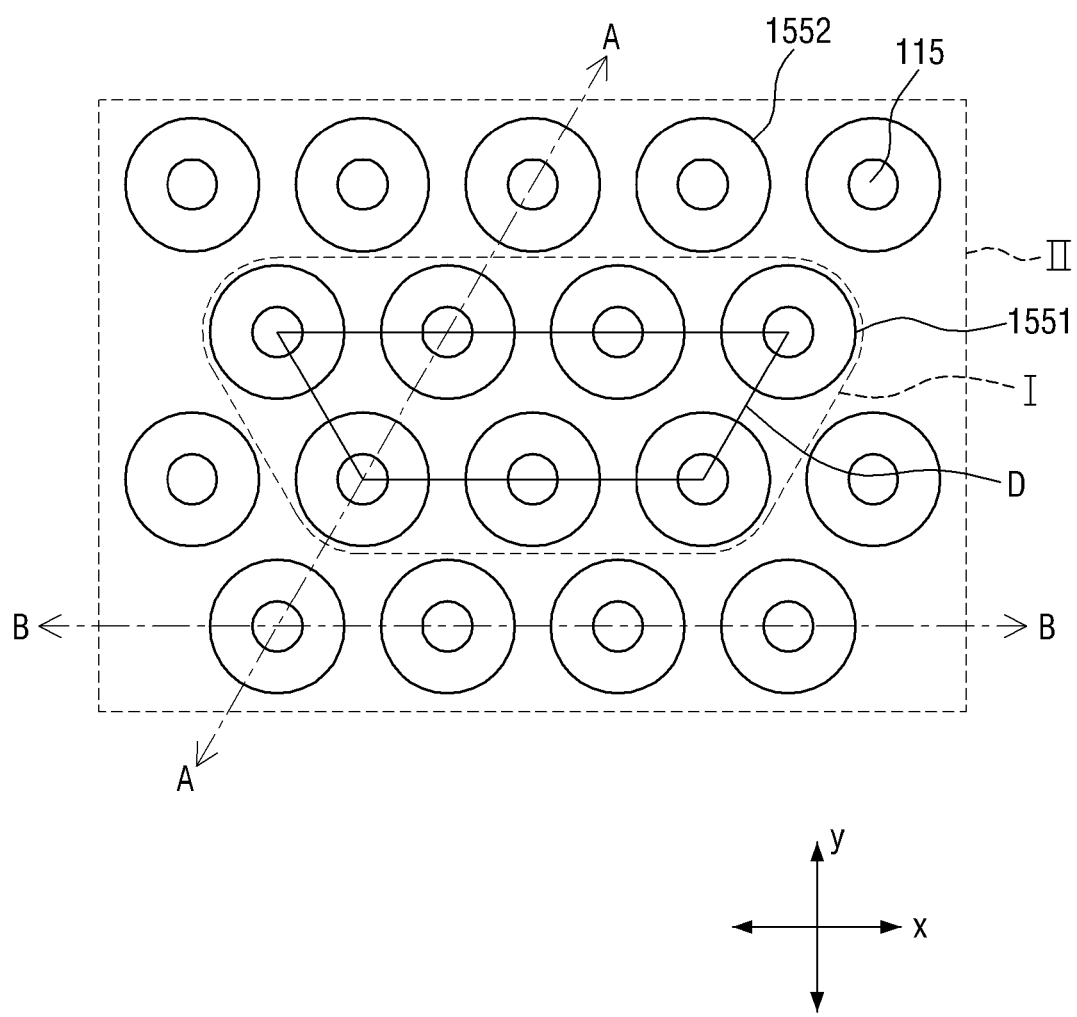
FIG. 1 is a layout view for explaining an exemplary semiconductor device according to one embodiment.

Advantages and features of the present disclosure may be understood more readily by reference to the following detailed description of various embodiments and the accompanying drawings. The present inventive concept may, however, be embodied in many different forms and should not be construed as being limited to the embodiments set forth herein. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Terms such as "between" or "adjacent" should be treated similarly. The term "contact," however, refers to direct contact, unless the context indicates otherwise. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. In many instances, these terms are used merely as a naming convention. Thus, unless the context indicates otherwise, these terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present inventive concept.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
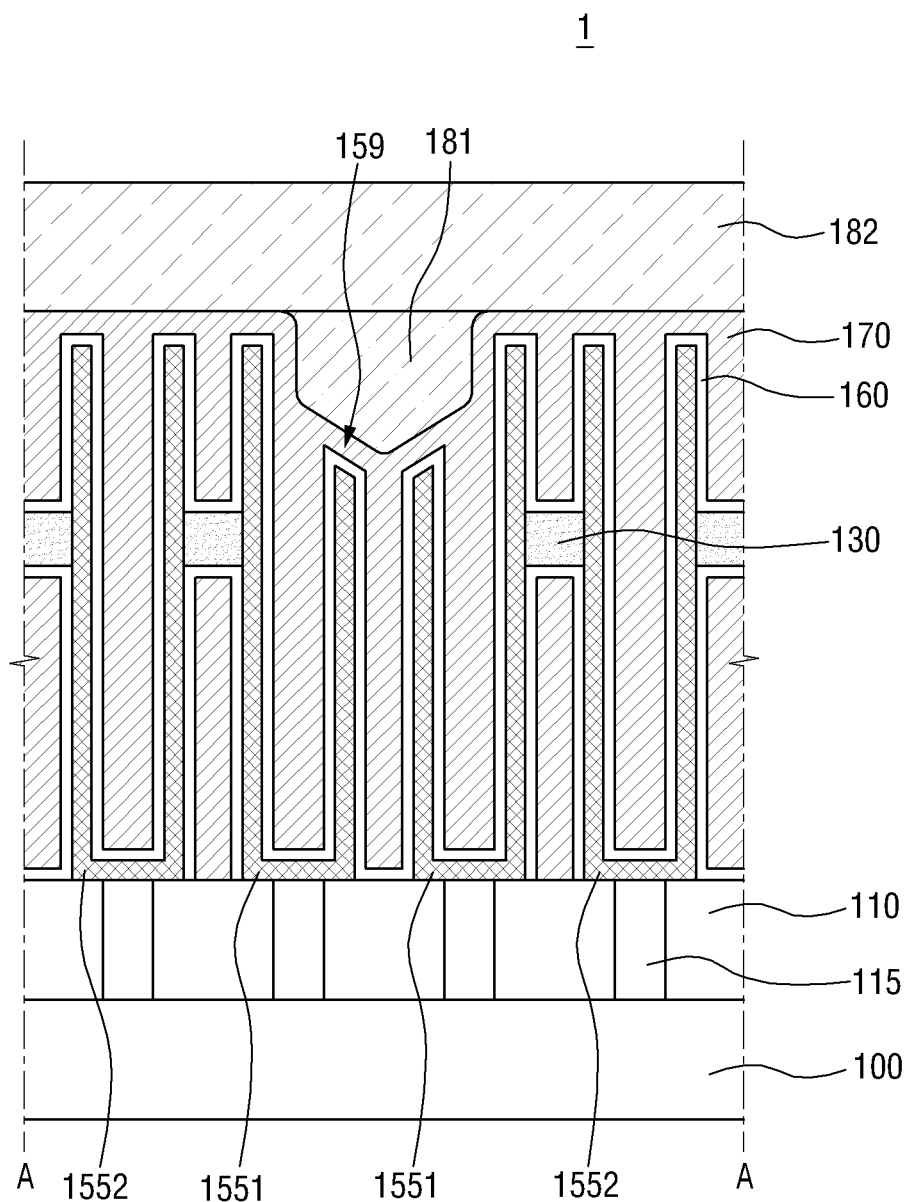
FIG. 2 is an exemplary cross-sectional view taken along the line A-A of FIG. 1.
Figure 3:
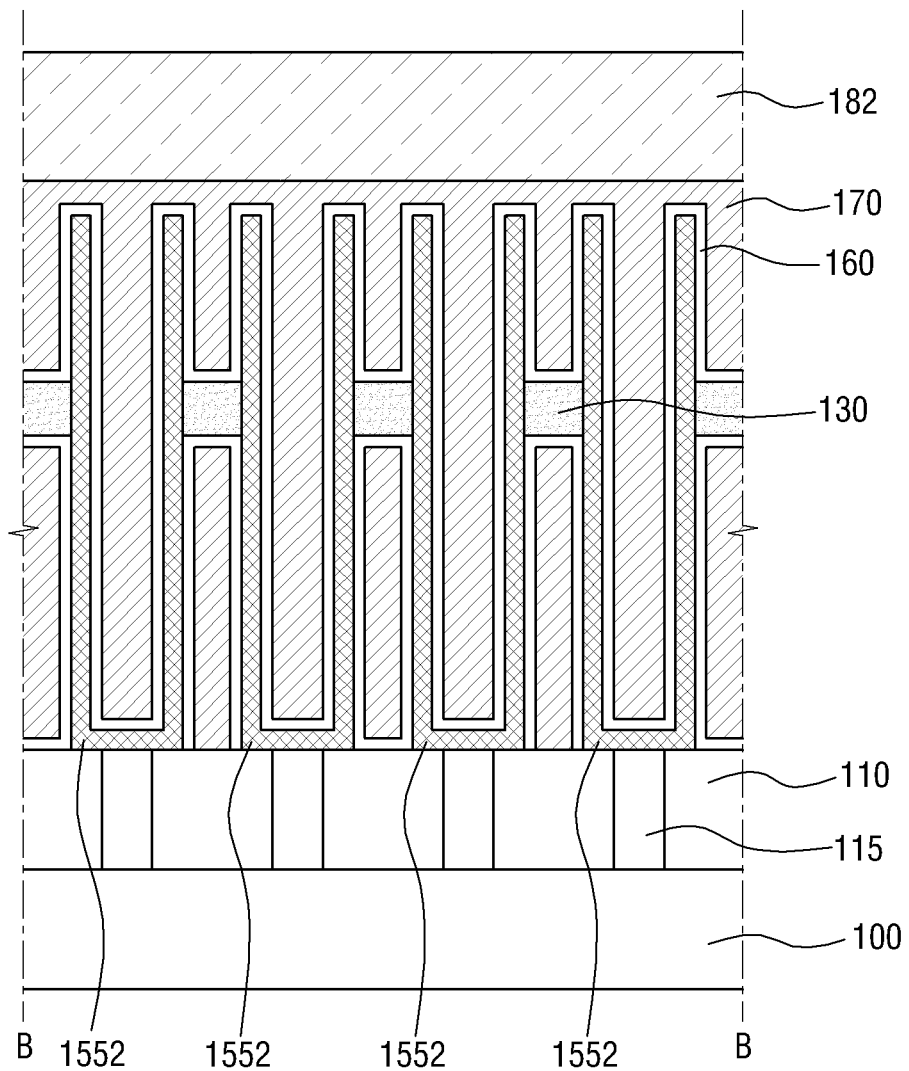
FIG. 3 is an exemplary cross-sectional view taken along the line B-B of FIG. 1.
Figure 4:
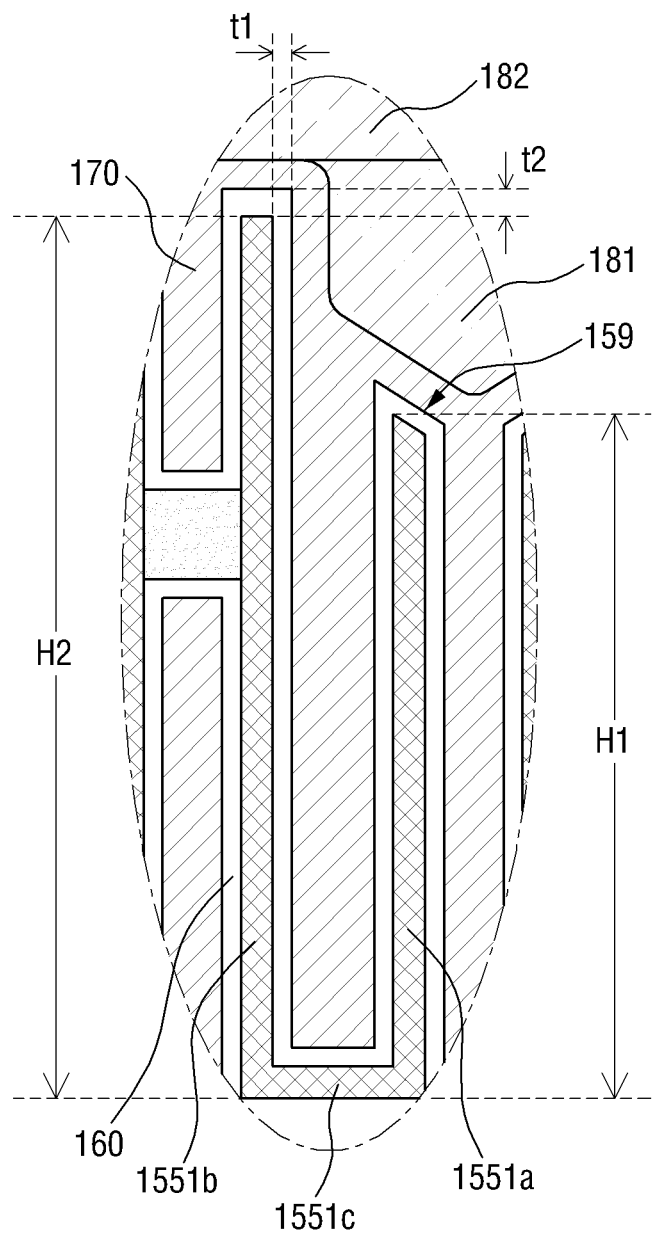
FIG. 4 is an exemplary partially enlarged view of FIG. 2.
Figure 5:
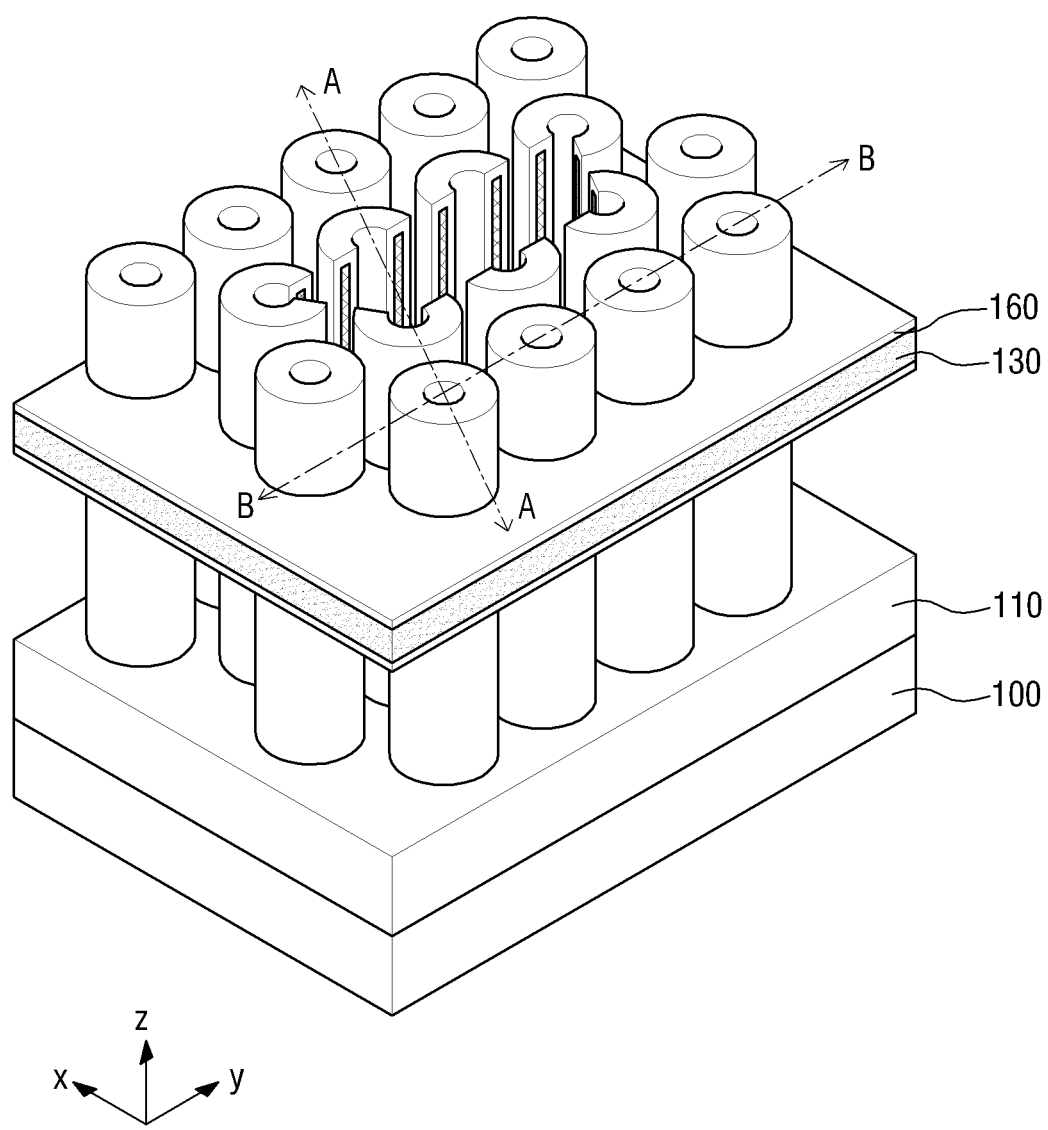
FIG. 5 is an exemplary perspective view illustrating an example of the semiconductor device shown in FIG. 1.

FIG. 1 is a layout view for explaining a semiconductor device according to an exemplary embodiment, FIG. 2 is an exemplary cross-sectional view taken along the line A-A of FIG. 1, FIG. 3 is an exemplary cross-sectional view taken along the line B-B of FIG. 1, FIG. 4 is an exemplary partially enlarged view of FIG. 2, and FIG. 5 is an exemplary perspective view illustrating an example of the semiconductor device shown in FIG. 1. For brevity, FIG. 5 does not illustrate a plate electrode.

Referring to FIGS. 1 to 5, the semiconductor device 1 according to one embodiment includes a substrate 100, an interlayer insulation film 110, a contact plug 115, storage electrodes 1551 and 1552, also referred to as lower electrodes or lower capacitor electrodes, a dielectric film 160, plate electrodes 170, 181 and 182, also collectively referred to as an upper electrode or upper capacitor electrode, and a supporter pattern 130.

The interlayer insulation film 110 may be positioned on the substrate 100. The substrate 100 may include, for example, at least one semiconductor material selected from the group consisting of Si, Ge, SiGe, GaP, GaAs, SiC, SiGeC, InAs and InP. The substrate 100 may also be a silicon on insulator (SOI) substrate. Alternatively, the substrate 100 may be a III-V group substrate. The interlayer insulation film 110 may include, for example, a dielectric material. For example, the interlayer insulation film 110 may include at least one of oxide, nitride and/or oxynitride.

A plurality of contact plugs 115 passing through the interlayer insulation film 110 may be disposed on the substrate 100. The contact plugs 115 may include, for example, at least one selected from the group consisting of a semiconductor material (e.g., polysilicon), a metal semiconductor compound (e.g., tungsten silicide), a conductive metal nitride (e.g., titanium nitride, tantalum nitride or tungsten nitride), and a metal (e.g., titanium, tungsten or tantalum).

Although not shown, a plurality of word lines and a plurality of bit lines crossing each other may be disposed on the substrate 100.

A plurality of storage electrodes 1551 and 1552 are formed on the substrate 100 and may be disposed on the interlayer insulation film 110 and the plurality of contact plugs 115. For example, the plurality of storage electrodes 1551 and 1552 may be electrically connected to the corresponding contact plugs 115, which further connect to circuitry within, for example, a semiconductor memory device.

The storage electrodes 1551 and 1552 may be in the shape of cylinders. For example, each of the storage electrodes 1551 and 1552 may include a bottom, horizontal portion, extending in parallel to the substrate 100 and a vertical portion, such as sidewalls upwardly extending from edges of the bottom. When the storage electrodes 1551 and 1552 are shaped of cylinders, lower surfaces of the bottoms of the storage electrodes 1551 and 1552 may come into contact with top surfaces of the contact plugs 115. Though the cylinders are shown to have a circular shape, cylinders that have other shapes, such as oval, hexagonal, rectangular, etc., may be used as well.

The storage electrodes 1551 and 1552 may have, for example, a horizontal bottom portion having a upper surface (also referred to as an inner bottom surface) and a lower surface (also referred to as an outer bottom surface), and one or more vertical portions, also referred to as vertical wall portions, having an surface facing outside of the cylinder (also referred to as an outer sidewall surface), an inner surface facing inside the cylinder (also referred to as an inner sidewall surface), and a top surface at the top of the cylinder.

The storage electrodes 1551 and 1552 may include conductive materials. For example, the storage electrodes 1551 and 1552 may include at least one selected from the group consisting of a doped semiconductor, a conductive metal nitride (e.g., titanium nitride, tantalum nitride or tungsten nitride), a metal (e.g., ruthenium, iridium, titanium or tantalum) and a conductive metal oxide (e.g., iridium oxide).

In certain embodiments, the plurality of storage electrodes 1551 and 1552 include first storage electrodes 1551 and second storage electrodes 1552 having different shapes.

In particular, a top portion of one sidewall 1551a of each of the first storage electrodes 1551 may have a recess 159. Therefore, as shown in FIG. 4, a first sidewall 1551a of each of the first storage electrodes 1551 may have a height H1, and a second sidewall 1551b of each of the first storage electrodes 1551 may have a height H2, which is greater than H1. The first sidewall 1551a and the second sidewall 1551b may be connected to each other through a bottom 1551c. The first sidewall 1551*a* and second sidewall 1551*b* may comprise the entire sidewall structure of the first storage electrode 1551.

The second storage electrodes 1552 may be shaped of cylinders without a recess, unlike the first storage electrodes 1551.

Stated differently, the first storage electrodes 1551 may be first vertical cylindrical lower capacitor electrodes (also generally referred to as first vertical cylindrical lower electrodes), which each include a full vertical portion (e.g., 1551*a*) and a shortened vertical portion (e.g., 1551*b*), also referred to as a cut-out vertical portion. The full vertical portion extends to a height (e.g., H2) higher than the height (e.g., H1) of the shortened vertical portion.

The second storage electrodes 1552 may be second vertical cylindrical lower capacitor electrodes (also generally referred to as second vertical cylindrical lower electrodes), which each include only a full portion, for example extending to the first height (e.g., H2) throughout the electrode.

In certain embodiments, the first and second storage electrodes can also be thought of as including lower portions and upper portions. For the first storage electrodes 1551, the lower portion of the electrode is a full cylinder (e.g., having vertical wall portions covering all sides), and the upper portion of the electrode is a partial cylinder (e.g., having a vertical wall portion on at least a first side but no walls on at least a second side). Thus, the lower portion may be referred to as a complete cylinder portion, and the upper portion may be referred to as an incomplete cylinder portion.

For the second storage electrodes 1552, both the lower portion of the electrode and the upper portion of the electrode include a full cylinder, or complete cylinder portion.

The first and second storage electrodes 1551 and 1552 may be arranged in an array pattern. As shown in FIG. 1, in order to minimize a layout size, the storage electrodes 1551 and 1552 may be arranged in a zigzag configuration. As such, the storage electrodes 1551 and 1552 may be arranged in an alternating, or staggered, arrangement in adjacent rows. For example, referring to FIG. 1, the second storage electrodes 1552 arranged on a first line in a first direction X to be parallel to each other, and the first storage electrodes 1551 arranged on a second line in the first direction X to be parallel to each other. The second storage electrodes 1552 arranged on the first line and the first storage electrodes 1551 arranged on the second line are not arranged to be parallel to each other in a second direction Y. As such, the first storage electrodes 1551 arranged on the second line may be obliquely arranged with respect to the second storage electrodes 1552 arranged on the first line. The overall arrangement of storage electrodes may be a hexagonal arrangement. In this manner, each storage electrode may be equidistant from six adjacent storage electrodes.

As shown in FIG. 1, the substrate 100 may have a first region (I) and a second region (II) defined thereon. A plurality of first storage electrodes 1551 may be arranged in the first region I, and a plurality of second storage electrodes 1552 may be arranged in the second region II. In certain embodiments, the plurality of second storage electrodes 1552 surround the plurality of first storage electrodes 1551.

The supporter pattern 130 may be formed to make contact with sidewalls (e.g., at outer sidewall surfaces) of the plurality of storage electrodes 1551 and 1552 adjacent thereto. Since the supporter pattern 130 makes contact with the plurality of storage electrodes 1551 and 1552, the plurality of storage electrodes 1551 and 1552 may remain in a standing position without collapsing.

Referring to FIGS. 1 to 5, the supporter pattern 130 may be formed between the plurality of storage electrodes 1551 and 1552. In one embodiment, the supporter pattern 130, also described generally as a support structure, is disposed between adjacent full vertical portions of the plurality of vertical cylindrical lower capacitor electrodes. Further, in one embodiment, the support structure is not disposed between adjacent shortened vertical portions of the plurality of vertical cylindrical lower capacitor electrodes.

The supporter pattern 130 may include, for example, silicon nitride, but aspects of the present inventive concept are not limited thereto. In addition, in the illustrated embodiment, while the supporter pattern 130 is formed of a single layer, aspects of the present inventive concept are not limited thereto. The supporter pattern 130 may be formed of multiple layers.

Referring to FIGS. 1 and 2, the supporter pattern 130 is formed between the plurality of second storage electrodes 1552 in the second region II. In addition, the supporter pattern 130 may be formed between the second storage electrodes 1552 in the second region II and the first storage electrodes 1551 in the first region I. The supporter pattern 130 may be partially removed from portions between the first storage electrodes 1551 in the first region I. As will later be described, the supporter pattern 130 may be partially removed using a mask pattern (e.g., 157 of FIG. 13) exposing a portion (e.g., D of FIG. 1) in the first region I. As will later be described, the supporter pattern 130 may be partially removed, thereby forming a dielectric film 160 and an upper electrode including 170, 181 and 182 between two storage electrodes 1551 (see FIGS. 17 and 18.). As will later be described, the forming of the recess 159 in the first storage electrodes 1551 may include removing portions of the first storage electrodes 1551 and removing a portion of the supporter pattern 130 (see FIGS. 13 and 14.).

The dielectric film 160 is formed on the storage electrodes 1551 and 1552. In one embodiment, the dielectric film 160 is conformally formed along top surfaces and sidewalls of the first storage electrodes 1551, a top surface of the supporter pattern 130 and sidewalls and top surfaces of the second storage electrodes 1552. In addition, the dielectric film 160 may be conformally formed along sidewalls of the first storage electrodes 1551, the bottom surface of the supporter pattern 130, and sidewalls of the second storage electrodes 1552. In one embodiment, the dielectric film 160 not formed at the supporter pattern 130 where it connects to the storage electrodes (e.g., where it contacts the storage electrodes). The dielectric film 160 may include an oxide (e.g., silicon oxide), a nitride (e.g., silicon nitride), an oxynitride (e.g., silicon oxynitride) or a high-k film. The high-k film may include, for example, $ZrO_2$, $Ta_2O_5$, BST, and PZT, but is not limited thereto.

In particular, as shown for example in FIG. 4, a thickness t2 of the dielectric film 160 formed on the top surfaces of the first storage electrodes 1551 may be greater than a thickness t1 of the dielectric film 160 formed on the sidewalls (e.g., inner sidewall surfaces and/or outer sidewall surfaces) of the first storage electrodes 1551. Similarly, a thickness of the dielectric film 160 formed on the top surfaces of the second storage electrodes 1552 may be greater than a thickness of the dielectric film 160 formed on the sidewalls of the second storage electrodes 1552.

An upper electrode, which may include 170, 181, and 182, is formed on the dielectric film 160 to cover the lower electrodes 1551 and 1552. The upper electrode, also referred to herein as a covering electrode, or plate electrode (as it serves the purpose of a traditional plate of a capacitor), may include different portions. For example, the upper electrode may include three portions, which may be referred to herein as plate electrode portions 170, 181 and 182. In one embodiment, the plate electrode portions 170, 181 and 182 include a first portion (e.g., 170) formed of a first material and that contacts the dielectric layer, a second portion (e.g., 181) formed of a second material different from the first material and that covers part of the first portion and covers shortened vertical portions of plurality of the second vertical cylindrical lower capacitor electrodes, and a third portion (e.g., 182) formed of a third material different from the first material and that covers the first portion and the second portion. In one embodiment, the upper electrode includes a metal layer, such as a metal film 170, a first semiconductor compound layer 181, and a second semiconductor compound layer 182, which are sequentially stacked on one another. These layers may be referred to, for example, as first through third portions, or as a top electrode portion, middle electrode portion, and bottom electrode portion.

The metal layer 170 may be formed to contact the dielectric film 160. The metal layer 170 may be formed to fill spaces between the sidewalls of the first storage electrodes 1551 and the sidewalls of the second storage electrodes 1552. In addition, the metal layer 170 may be formed to fill the inner cylindrical space in the first storage electrodes 1551 and the inner cylindrical spaces in the second storage electrodes 1552.

The metal layer 170 may be generally formed, for example, using TiN and may include WN, TaN, Cu, Al or W. Alternatively, the metal layer 170 may include a noble metal, such as Pt, Ir, Ru, Rh, Os, or Pd, an oxide film of such a noble metal, or a multi-layered metal layer of TiN/W, TiN/TaN, or WN/W.

The first semiconductor compound layer 181 is formed on the metal layer 170. In addition, the first semiconductor compound layer 181 may be formed in the recess 159 on the first storage electrodes 1551. In addition, the first semiconductor compound layer 181 may be formed in the recess 159 on one sidewall 1551a of each of the first storage electrodes 1551, and the second semiconductor compound layer 182 is formed in contact with the first semiconductor compound layer 181. The second semiconductor compound layer 182 may be formed in contact with the metal layer 170 on the other sidewall 1551b of each of the first storage electrodes 1551. In addition, the second semiconductor compound layer 182 may be formed in contact with the metal layer 170 on the second storage electrodes 1552. In one embodiment, the first semiconductor compound layer 181 not formed on the second storage electrodes 1552. As such, in a first region that includes shortened vertical portions of the first storage electrodes 1551, the shortened vertical portions of the first storage electrodes 1551 face each other, and the portion 181 (e.g., first semiconductor compound layer) of the upper electrode is formed in the first region and covers the shortened vertical portions 1551a of the first storage electrodes 1551.

In one embodiment, the first semiconductor compound layer 181 and the second semiconductor compound layer 182 have different crystallinities. For example, the crystallinity of the first semiconductor compound layer 181 may be lower than that of the second semiconductor compound layer 182. For example, the first semiconductor compound layer 181 may be amorphous and the second semiconductor compound layer 182 may have a crystallinity of a particular direction.

In addition, the first semiconductor compound layer 181 and the second semiconductor compound layer 182 may include a plurality of semiconductor elements, which are the same as each other, and the first semiconductor compound layer 181 and the second semiconductor compound layer 182 have different composition ratios. For example, the first semiconductor compound layer 181 and the second semiconductor compound layer 182 may include SiGe, and the Si concentration of the first semiconductor compound layer 181 may be different from that of the second semiconductor compound layer 182. In detail, the Si concentration of the first semiconductor compound layer 181 may be higher than that of the second semiconductor compound layer 182. In general, the higher the Si concentration, the lower the crystallinity of the semiconductor compound.

In certain embodiments, the first semiconductor compound layer 181 and the second semiconductor compound layer 182 may be doped with an impurity, such as a P type impurity. The doping of the P type impurity may reduce surface resistance of each of the first semiconductor compound layer 181 and the second semiconductor compound layer 182.

The two semiconductor compounds 181 and 182 having different crystallinities are used for the following exemplary reasons.

After forming a capacitor, impurities, such as hydrogen ions, may penetrate into the dielectric film 160. However, since it is difficult for the hydrogen ions to pass the supporter pattern 130, inferiority is unlikely to occur to a capacitor formed by the second storage electrodes 1552. However, inferiority may often occur to a capacitor formed by the recessed first storage electrodes 1551 (for example, the supporter pattern 130 having a portion removed therefrom) because hydrogen ions penetrate into the recess 159 without the supporter pattern 130.

In the semiconductor device 1 according to one embodiment, the first semiconductor compound layer 181 having a low crystallinity (or a high Si concentration) is formed in the recess 159. It is difficult for the hydrogen ions to pass the first semiconductor compound layer 181. To further explain, if the first semiconductor compound layer 181 and the second semiconductor compound layer 182 have different crystallinities, a path along which the hydrogen ions move to the dielectric film 160 is extended, making it difficult for the hydrogen ions to penetrate the dielectric film 160. Therefore, it is possible to reduce inferiority occurring to the capacitor formed by the first storage electrodes 1551 having the recess 159.

The first semiconductor compound layer 181 having a low crystallinity has higher resistance than the second semiconductor compound layer 182 having a high crystallinity. Therefore, when only the first semiconductor compound layer 181 is used without using the second semiconductor compound layer 182, the resistance of the capacitor may excessively increase. Therefore, in certain embodiments, the first semiconductor compound layer 181 is formed only in the recess 159 from which the supporter pattern 130 is removed, and the first semiconductor compound layer 181 not formed in the other regions. Therefore, the electrode portions 170, 181 and 182 in the recess 159 are configured such that in one embodiment, a metal layer 170, a first semiconductor compound layer 181, and a second semiconductor compound layer 182 are stacked. By contrast, the electrode portions 170 and 182 in the other regions are configured such that the metal layer 170 and the second semiconductor compound layer 182 are stacked.

Meanwhile, portions of the top surfaces of the first storage electrodes 1551 and the top surfaces of the second storage electrodes 1552 may contact the second semiconductor compound layer 182. As described above, in certain embodiments, the thickness of the dielectric film 160 formed on the top surfaces of the first storage electrodes 1551 and the second storage electrodes 1552 is greater than that of the dielectric film 160 formed on the sidewalls of the first storage electrodes 1551 and the second storage electrodes 1552.

Since the dielectric film 160 formed on the top surfaces of the first storage electrodes 1551 and the second storage electrodes 1552 is relatively thick, it is less affected by the penetrating hydrogen ions.

As a result of the structure described above, a hydrogen blocking structure is formed in the semiconductor device to cover the storage electrodes. The hydrogen blocking structure includes electrode portion 181 in some regions, a thicker dielectric film 160 in other regions, and the support structure 130 in other regions. Collectively, these components may form a continuous hydrogen blocking structure across the semiconductor device.

Figure 6:
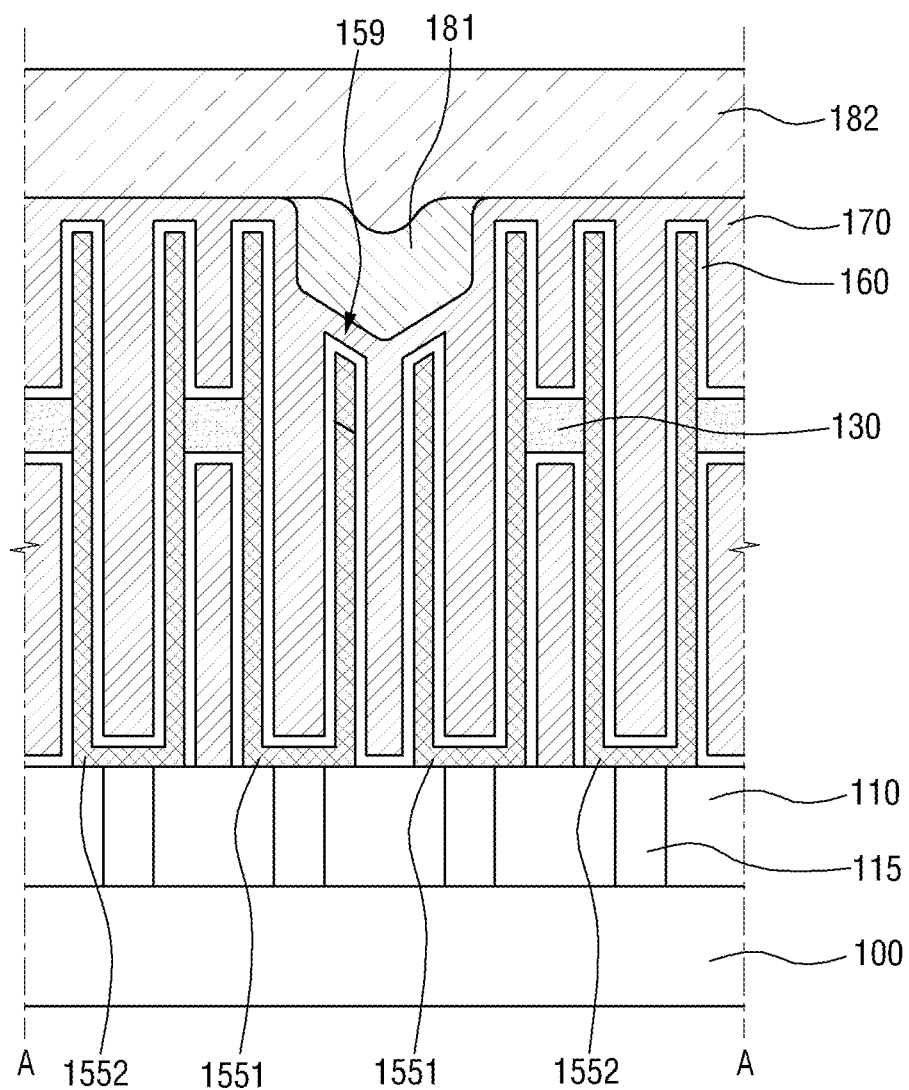
FIG. 6 is a cross-sectional view for explaining an exemplary semiconductor device according to another embodiment.

FIG. 6 is a cross-sectional view for explaining a semiconductor device according to another exemplary embodiment. For the sake of convenient explanation, the following description will focus on differences between the current embodiment and the previous embodiment shown in FIGS. 1 to 5.

In the semiconductor device 1 according to one embodiment as shown in FIG. 2, the first semiconductor compound layer 181 completely fills the recess 159.

However, in the semiconductor device 2 according to another embodiment as shown in FIG. 6, a first semiconductor compound layer 181 may fill only a portion of a recess 159 without completely filling the recess 159. The recess 159 that is not filled by the first semiconductor compound layer 181 may be filled by the second semiconductor compound layer 182.

Hereinafter, a fabricating method of the semiconductor device according to certain embodiments will be described with reference to FIGS. 7 to 19 and FIG. 2. FIGS. 7 to 19 illustrate exemplary intermediate process steps for explaining the fabricating method of the semiconductor device according to certain embodiments. Specifically, FIGS. 8, 10, 12, 14 and 16 are cross-sectional views taken along the lines A-A of FIGS. 7, 9, 11, 13 and 15.

Figure 7:
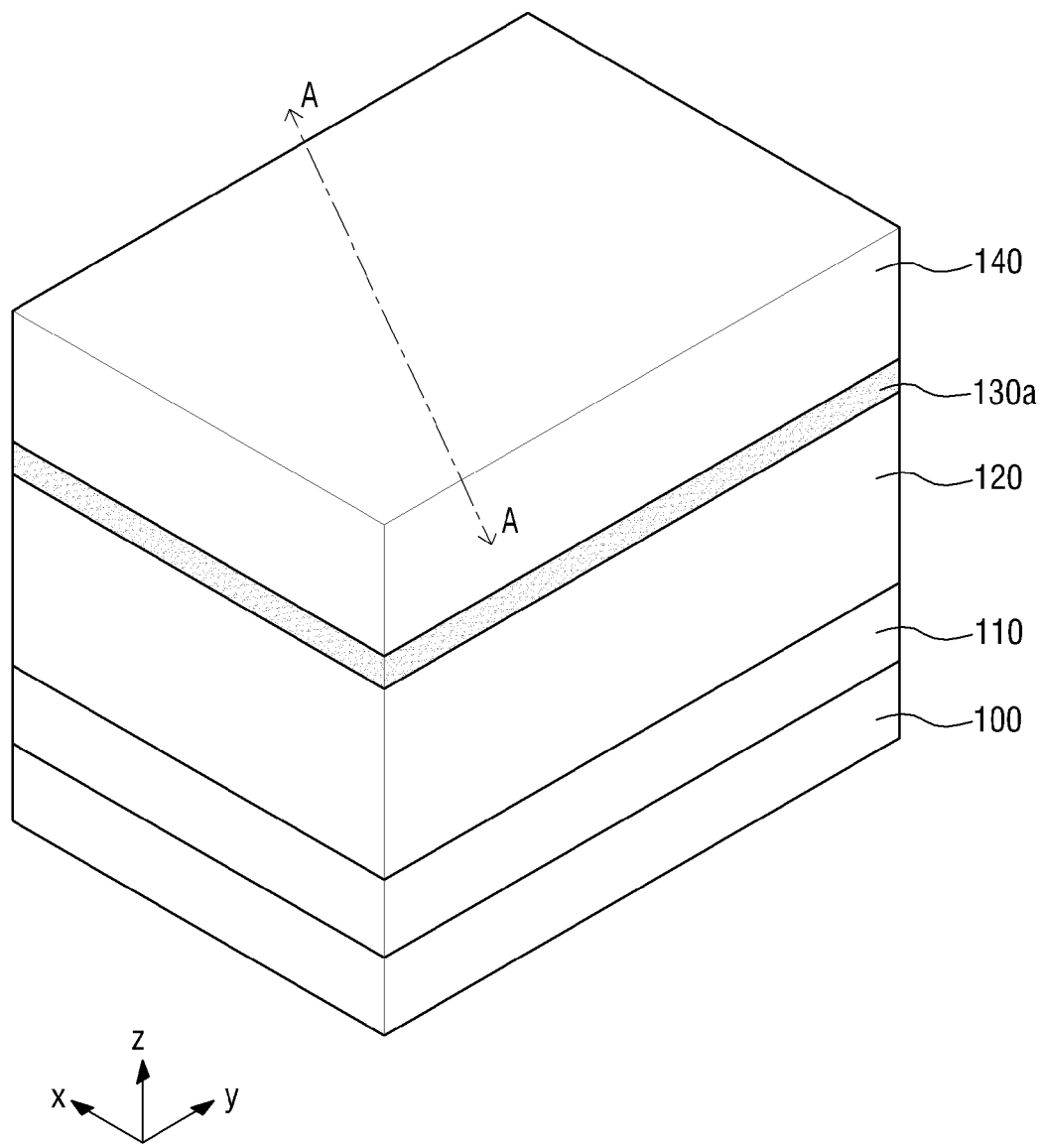
FIGS. 7 to 19 illustrate exemplary intermediate process steps for explaining the fabricating method of a semiconductor device according to certain embodiments.
Figure 8:
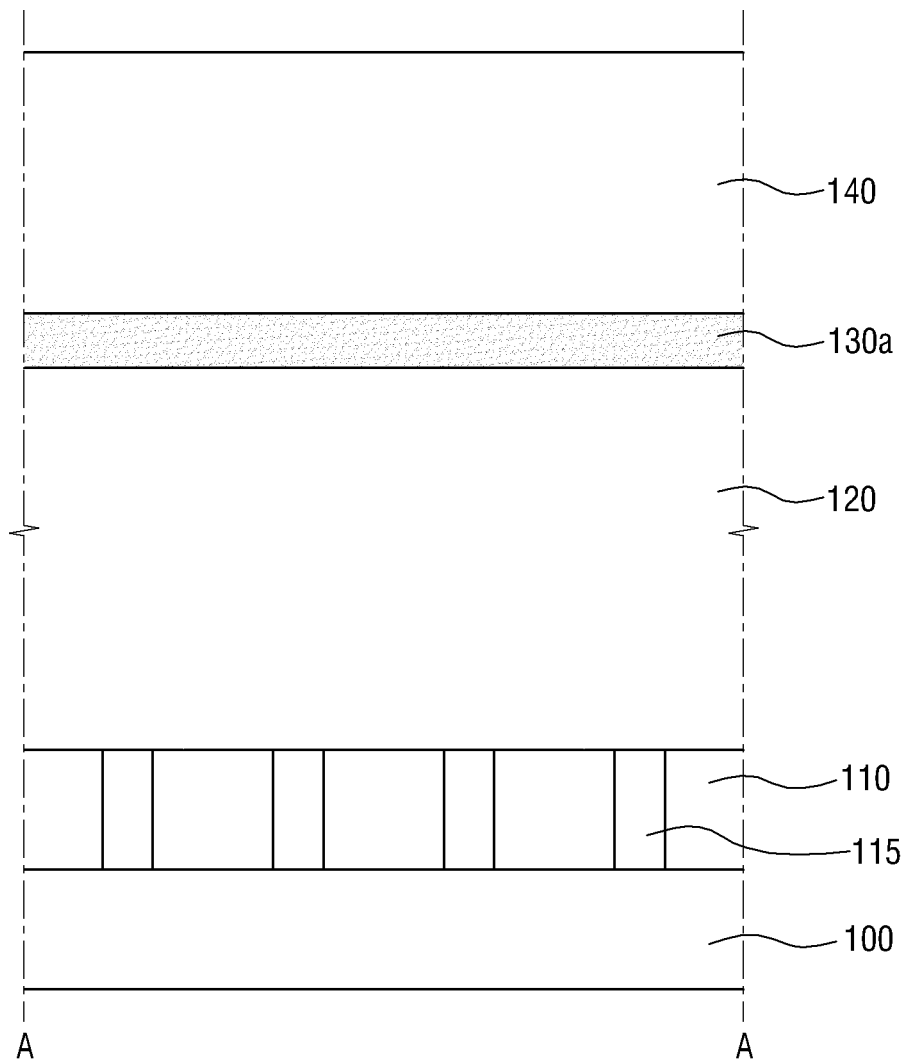

First, referring to FIGS. 7 and 8, a first mold film 120, a support film 130*a* and a second mold film 140 sequentially stacked on the substrate 100 are formed. The first mold film 120 and the second mold film 140 may be oxide films, for example, and the support film 130*a* may include, for example, a material having etching selectivity with respect to the first mold film 120 and the second mold film 140. The mold films 120 and 140 and the support film 130*a* may also be generally referred to herein as layers.

Figure 9:
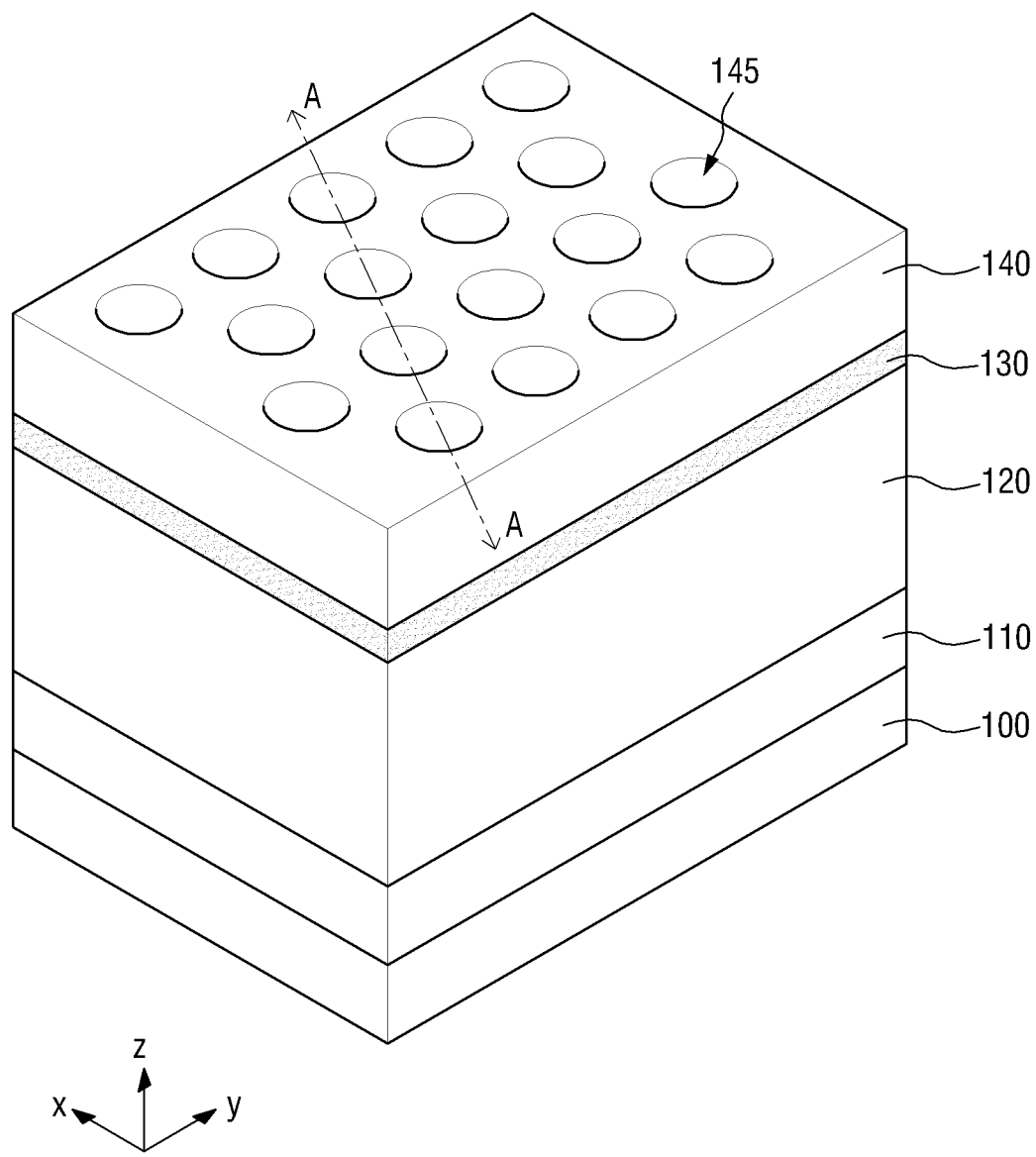
Figure 10:
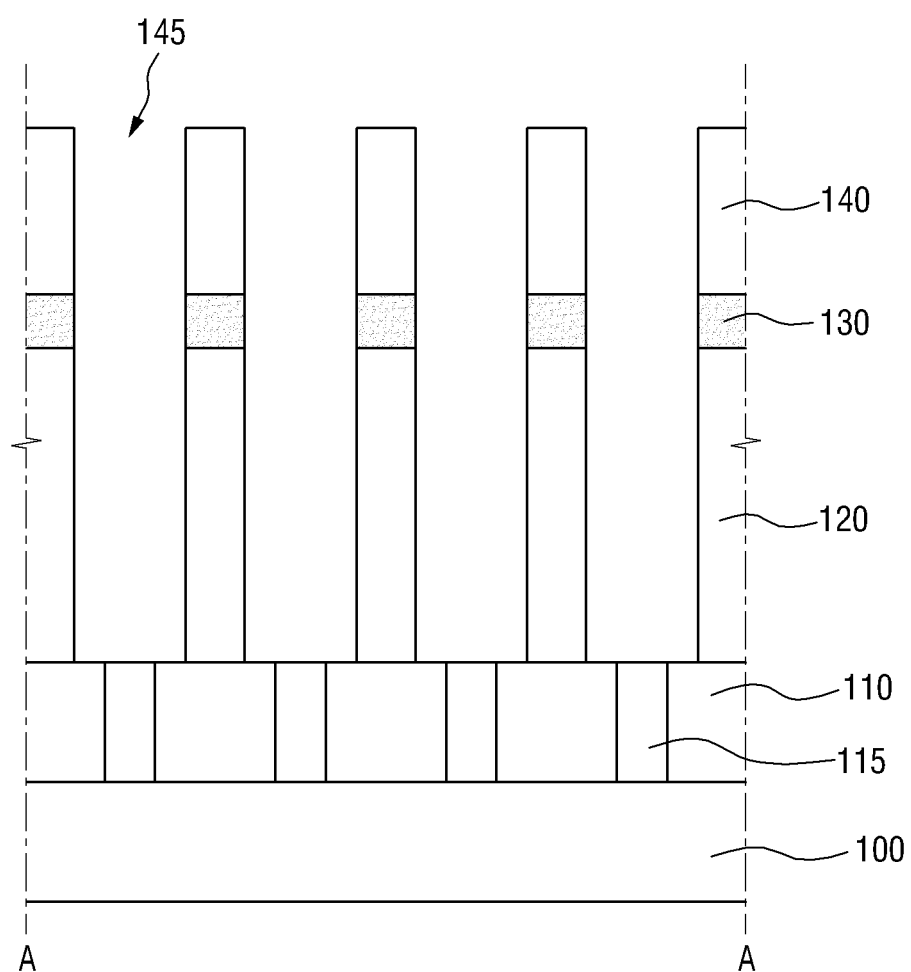

Referring to FIGS. 9 and 10, a plurality of holes 145 passing through the first mold film 120, the support film 130*a* and the second mold film 140 are formed on the substrate 100. The respective holes 145 may expose the corresponding contact plugs 115.

Figure 11:
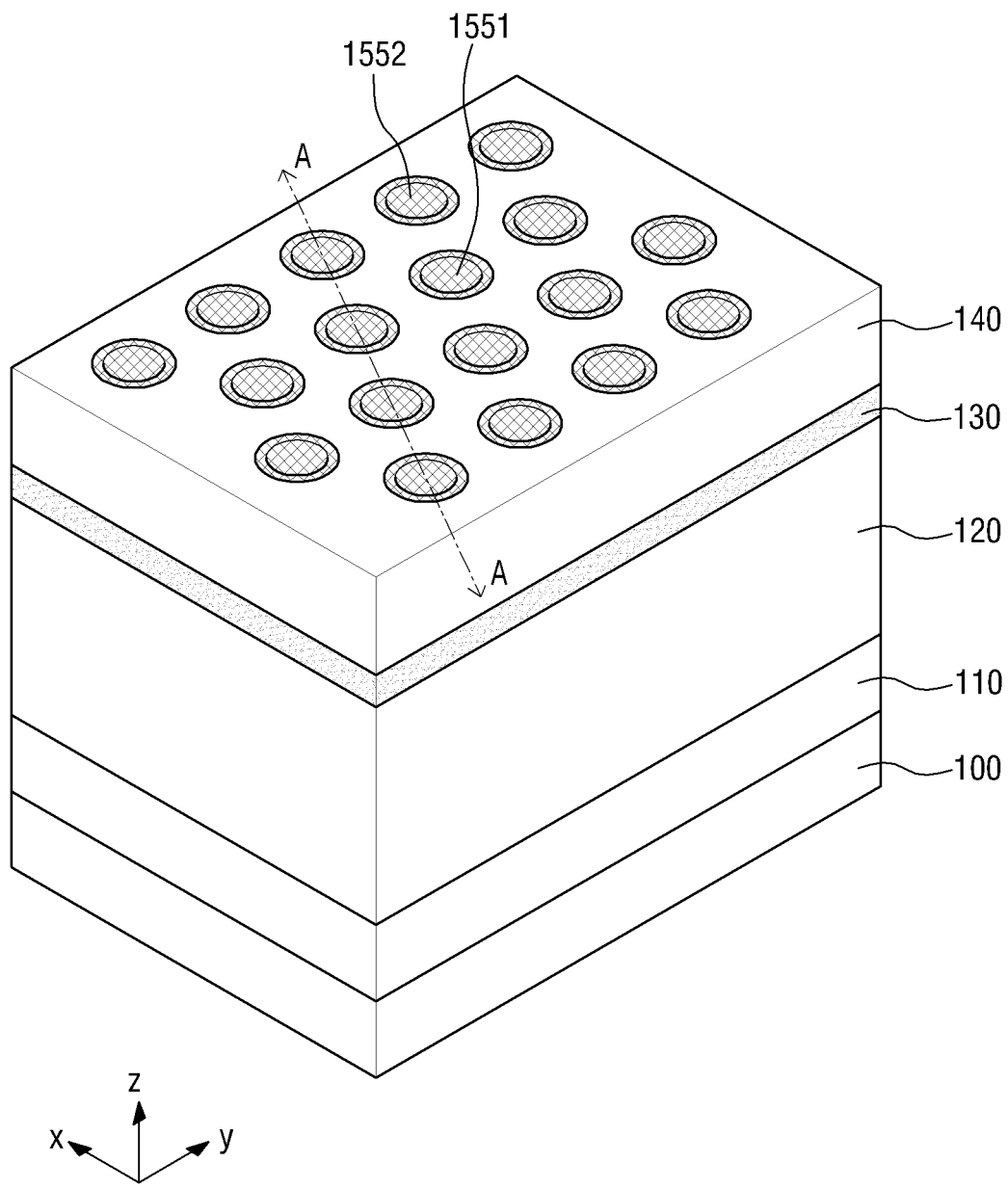
Figure 12:
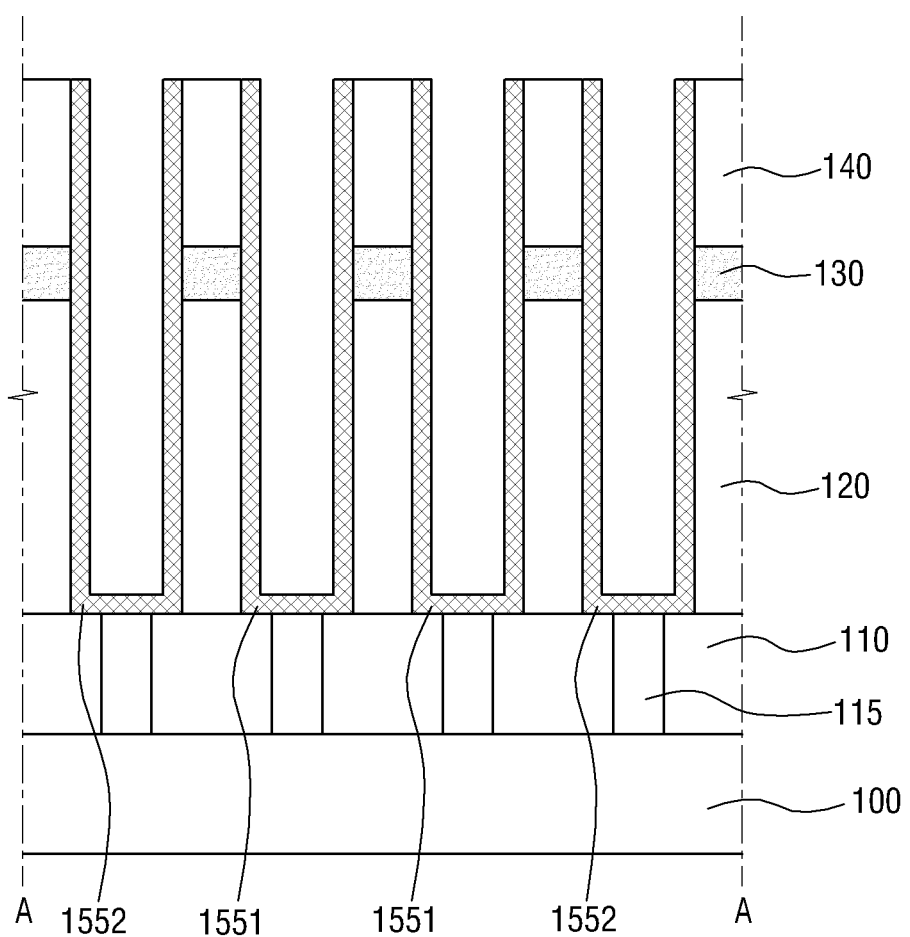

Referring to FIGS. 11 and 12, a plurality of storage nodes 1551 and 1552 are formed in the holes 145. For example, the plurality of storage nodes 1551 and 1552 may be conformally formed along sidewalls and bottom surfaces of the corresponding holes 145.

Figure 13:
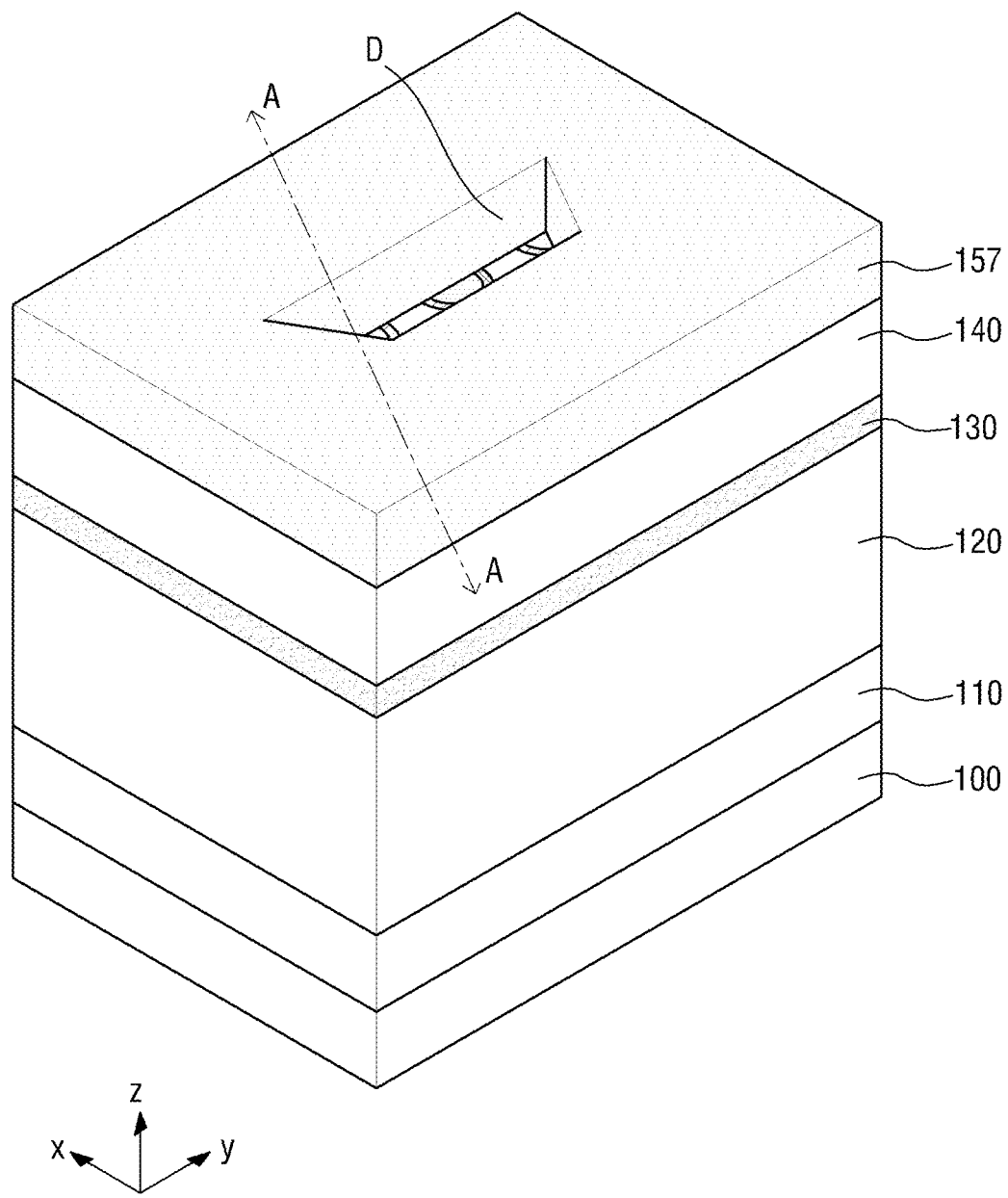
Figure 14:
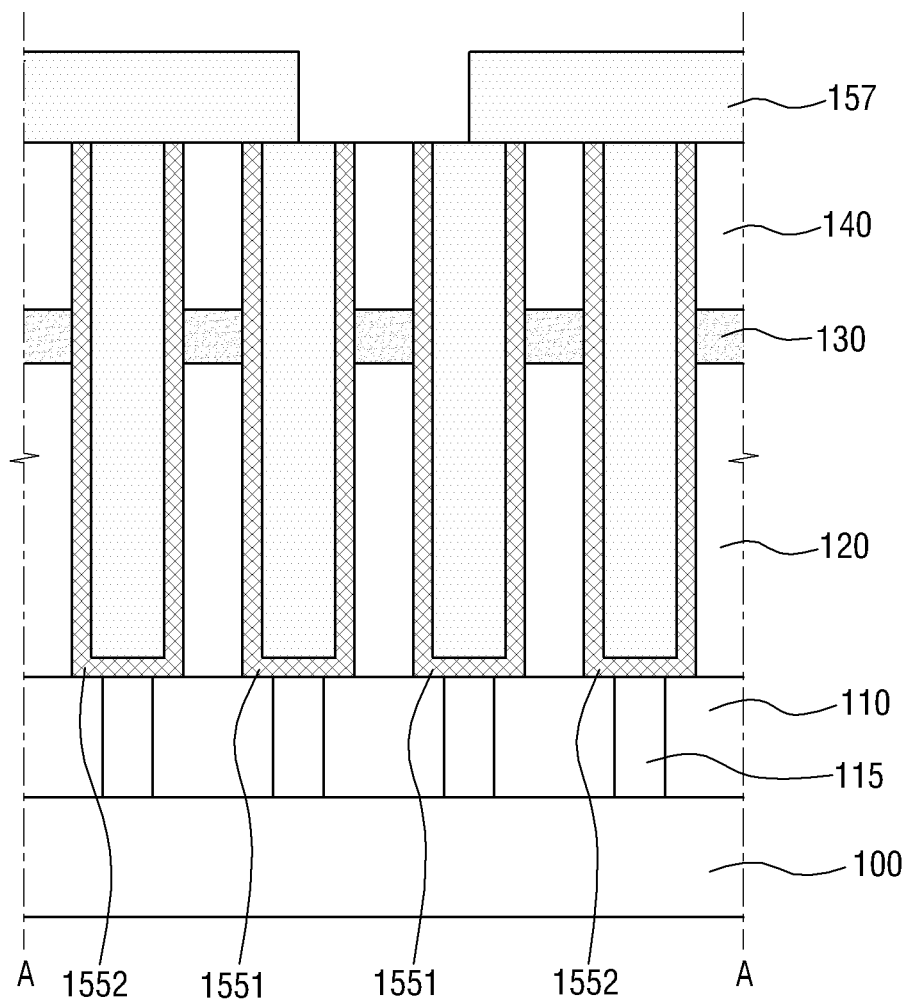

Referring to FIGS. 13 and 14, a mask pattern 157 is formed on the second mold film 140. The mask pattern 157 may expose a portion D in a first region I. The mask pattern 157 may be formed, for example, by forming a mask film filling the holes 145 on the second mold film 140, and patterning the mask film.

Figure 15:
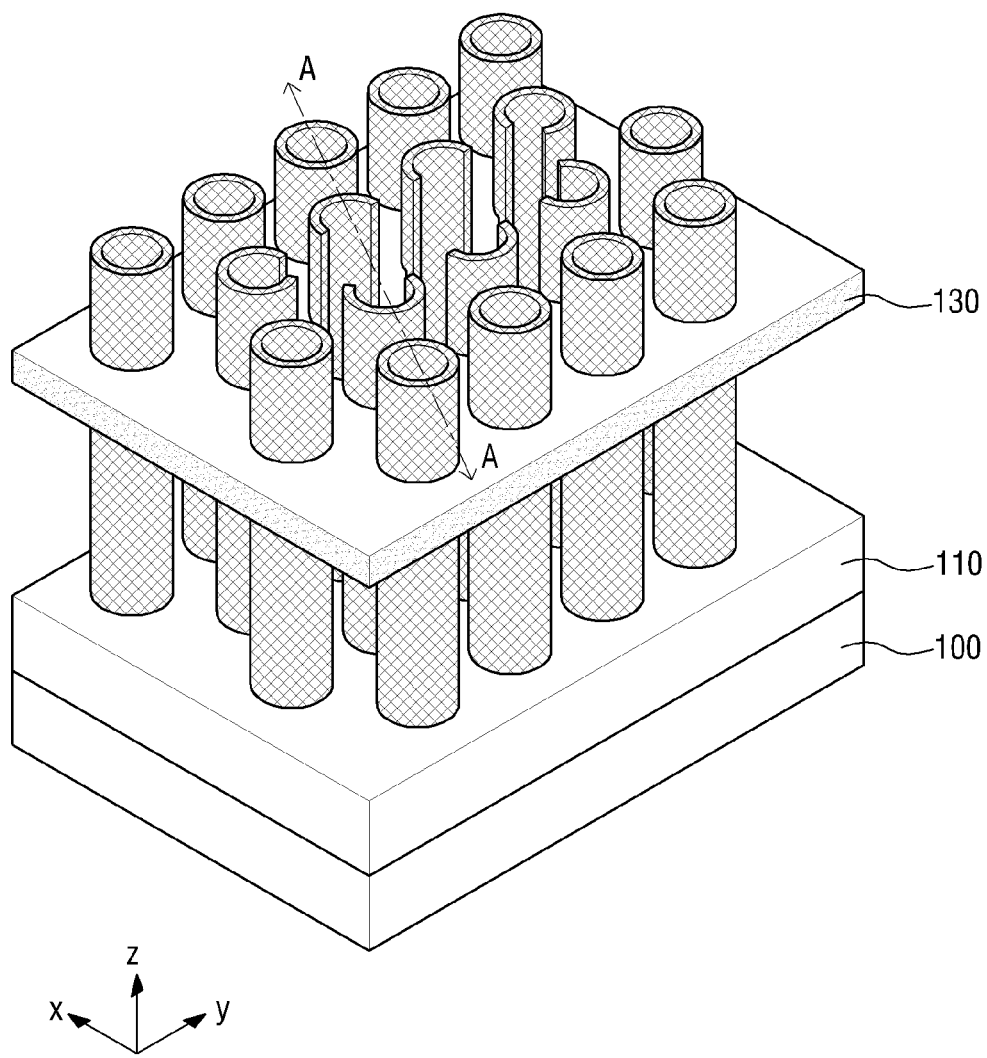
Figure 16:
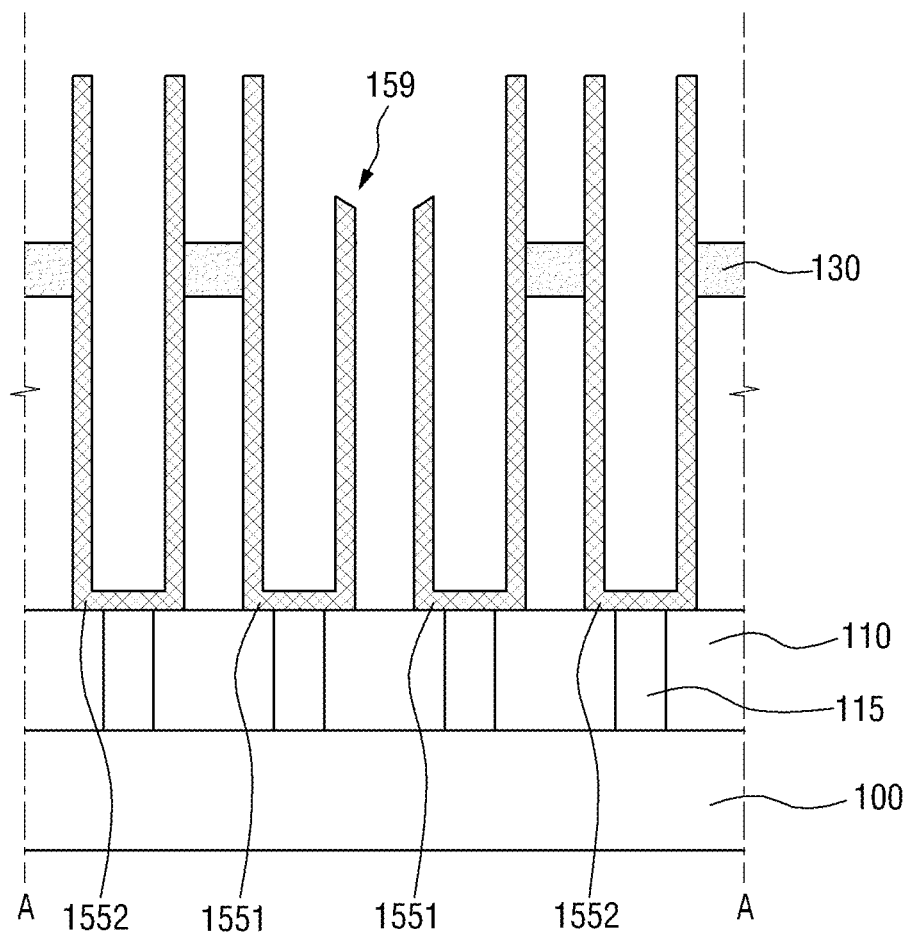

Referring to FIGS. 15 and 16, a portion of the exposed second mold film 140 and a portion of the exposed supporter pattern 130 is etched using the mask pattern 157 as an etch mask. In addition, portions of the first storage electrodes 1551 are removed while removing a portion of the supporter pattern 130. As a result, the recess 159 is formed in each of the first storage electrodes 1551.

Next, the mask pattern 157 is removed.

Next, the first mold film 120 and the second mold film 140 remaining on the substrate 100 are removed.

Figure 17:
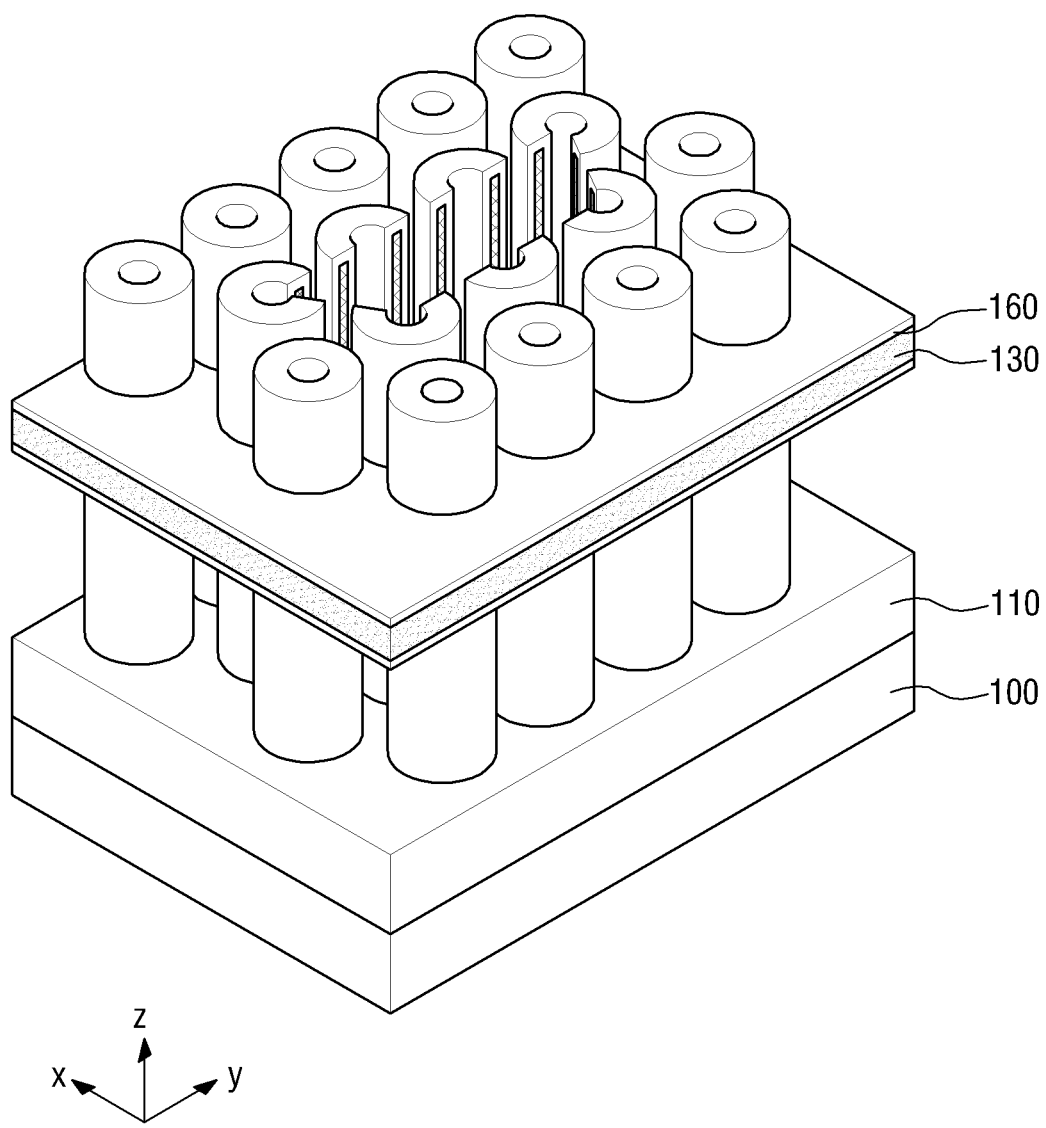

Referring to FIG. 17, the dielectric film 160 is formed on the substrate 100 where the first mold film 120 and the second mold film 140 were removed. For example, the dielectric film 160 may be conformally formed along the top surfaces and sidewalls of the first storage electrodes 1551 and top surface of the supporter pattern 130 and sidewalls and top surfaces of the second storage electrodes 1552. In addition, the dielectric film 160 may be conformally formed along the sidewalls of the first storage electrodes 1551, the bottom surface of the supporter pattern 130 and the sidewalls of the second storage electrodes 1552. As such, the dielectric film 160 may be formed on portions of the sidewalls of the storage electrodes 1551 and 1552 shielded by the supporter pattern 130. Stated differently, the dielectric film 160 may be formed throughout inner sidewall surfaces, on inner bottom surfaces, and on a top surface of the first storage electrodes 1551 and second storage electrodes 1552, and may also be formed throughout outer shortened sidewall surfaces of the first storage electrodes 1551, on outer full sidewall surfaces of the first storage electrodes 1551 and second storage electrodes 1552 both above and below the supporter pattern 130, and on a top surface and bottom surface of the supporter pattern 130.

In order to form the dielectric film 160, in one embodiment, chemical vapor deposition (CVD) or atomic layer deposition (ALD) having excellent step coverage may be used.

Figure 18:
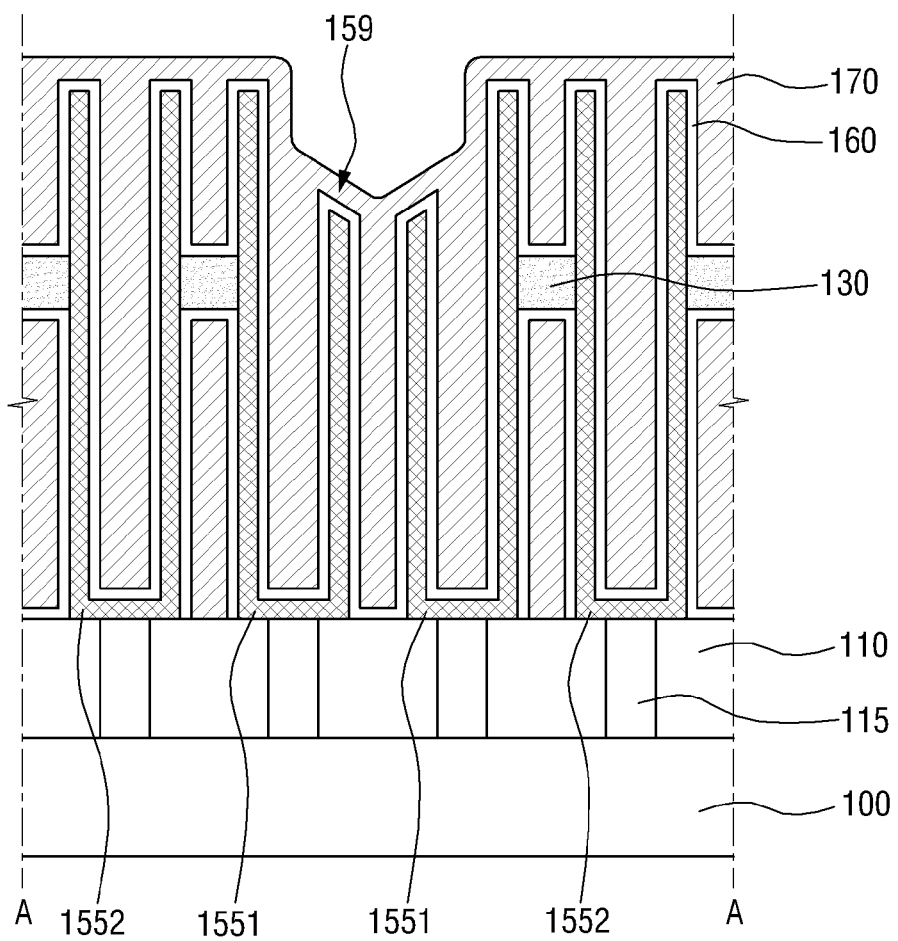

Referring to FIG. 18, a first electrode portion (e.g., the metal film 170) of the upper electrode is formed on the dielectric film 160. The first electrode portion may be formed to contact the dielectric film 160. The first electrode portion may be formed to fill spaces between the sidewalls of the first storage electrodes 1551 and the sidewalls of the second storage electrodes 1552.

In order to form the first electrode portion, CVD, ALD, or metal organic CVD ((MOCVD) may be used.

Figure 19:
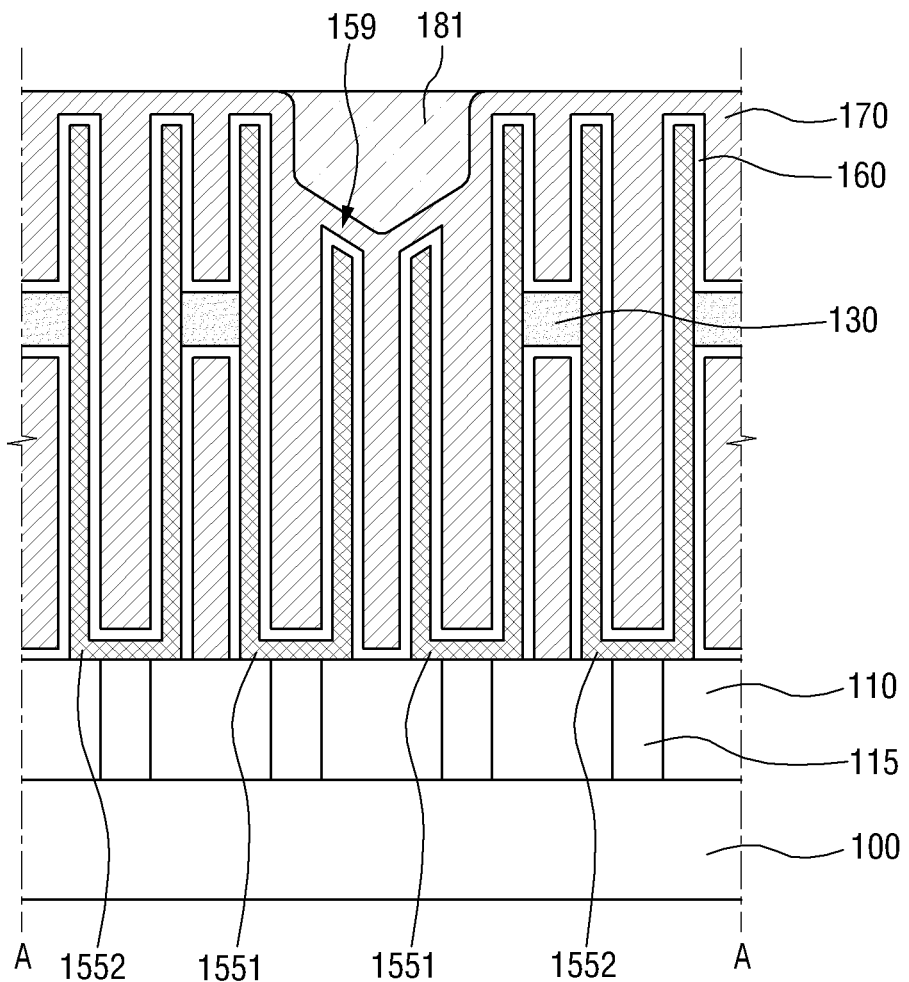

Referring to FIG. 19, a second electrode portion (e.g., first semiconductor compound layer 181) may be formed in the recess 159 on the first electrode portion. Referring to FIG. 2, the third electrode portion (e.g., second semiconductor compound layer 182) is formed on the second electrode portion.

In one embodiment, the first semiconductor compound layer 181 and the second semiconductor compound layer 182 may be in-situ formed. For example, first, Si source gas and Ge source gas are supplied to a processing chamber. In one embodiment, the Si source gas supplied is increased until the recess 159 is filled, thereby completing the first semiconductor compound layer 181 having a high Si concentration. Next, the Si source gas supplied is reduced, thereby completing the second semiconductor compound layer 182 having a low Si concentration. As described above, if the Si concentration varies, the crystallinity may vary. As a result, the first semiconductor compound layer 181 may have a low crystallinity and the second semiconductor compound layer 182 may have a high crystallinity.

In addition, the first semiconductor compound layer 181 and the second semiconductor compound layer 182 may be doped with impurities, such as a P type impurity. In order to implant the P type impurity, boron (B), for example, may also be supplied while supplying Si source gas and Ge source gas. In addition, after forming an SiGe layer, B may be doped by implanting the B impurity into the SiGe layer.

Alternatively, the first semiconductor compound layer 181 may initially sufficiently cover in the substrate 100 having the recess 159. For example, the first semiconductor compound layer 181 may completely cover the first storage electrodes

1551 and the second storage electrodes 1552. Subsequently, the first semiconductor compound layer 181 may remain only in the recess 159 through a planarization process. Thereafter, the second semiconductor compound layer 182 may be formed.

Figure 20:
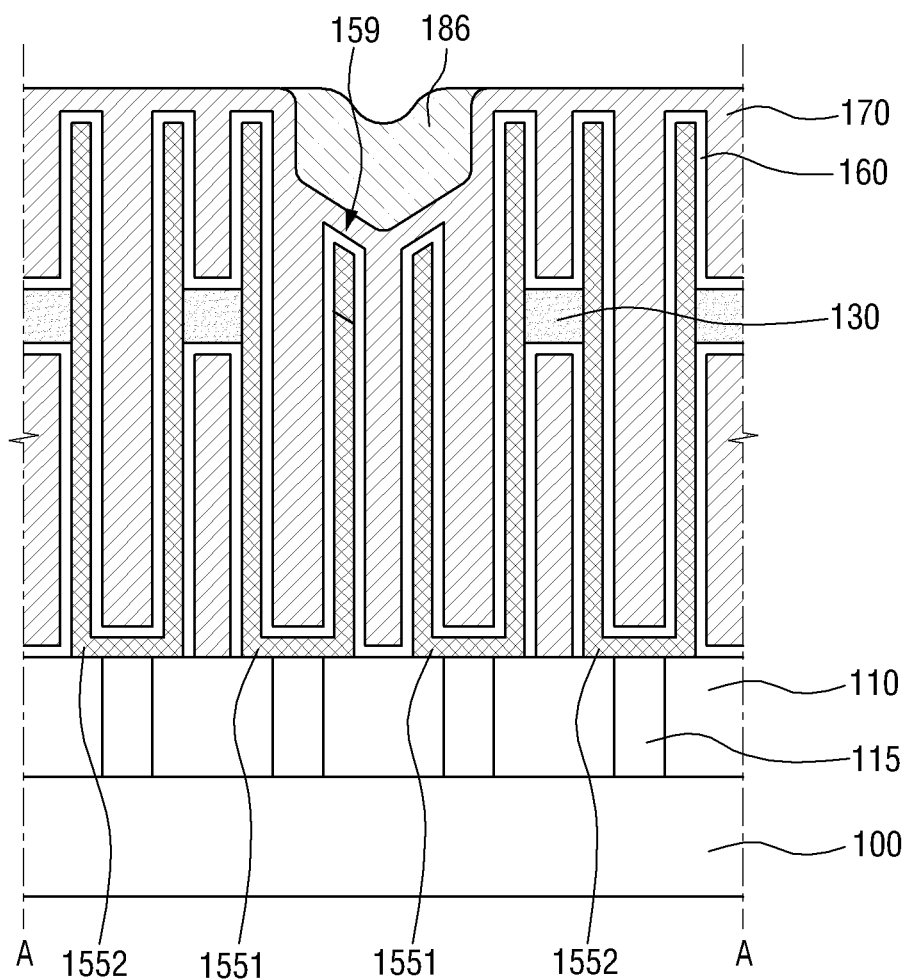
FIG. 20 illustrates an exemplary intermediate process step for explaining a fabricating method of a semiconductor device according to another embodiment.

FIG. 20 illustrates an exemplary intermediate process step for explaining a fabricating method of a semiconductor device according to another embodiment. For the sake of convenient explanation, the following description will focus on differences between the current embodiment and the previous embodiment shown in FIGS. 7 to 19 and FIG. 2. The process steps other than the process steps shown in FIGS. 19 and 2 are substantially the same as those of the previous embodiment.

Referring to FIG. 20, a silicon (Si) layer 186 is formed in the recess 159 on the metal film 170. The Si layer 186 may be formed as much as only several angstroms without sufficiently filling the recess 159. Next, referring to FIG. 6, the Si source gas and the Ge source gas are supplied, thereby forming an SiGe layer on the Si layer 186. Then, Ge diffusion may occur due to a difference in the Ge concentrations between the Si layer and the SiGe layer. As a result, the first semiconductor compound layer 181 having a high Si concentration is formed in the recess 159, and the second semiconductor compound layer 182 having a low Si concentration is formed on the first semiconductor compound layer 181.

Figure 21:
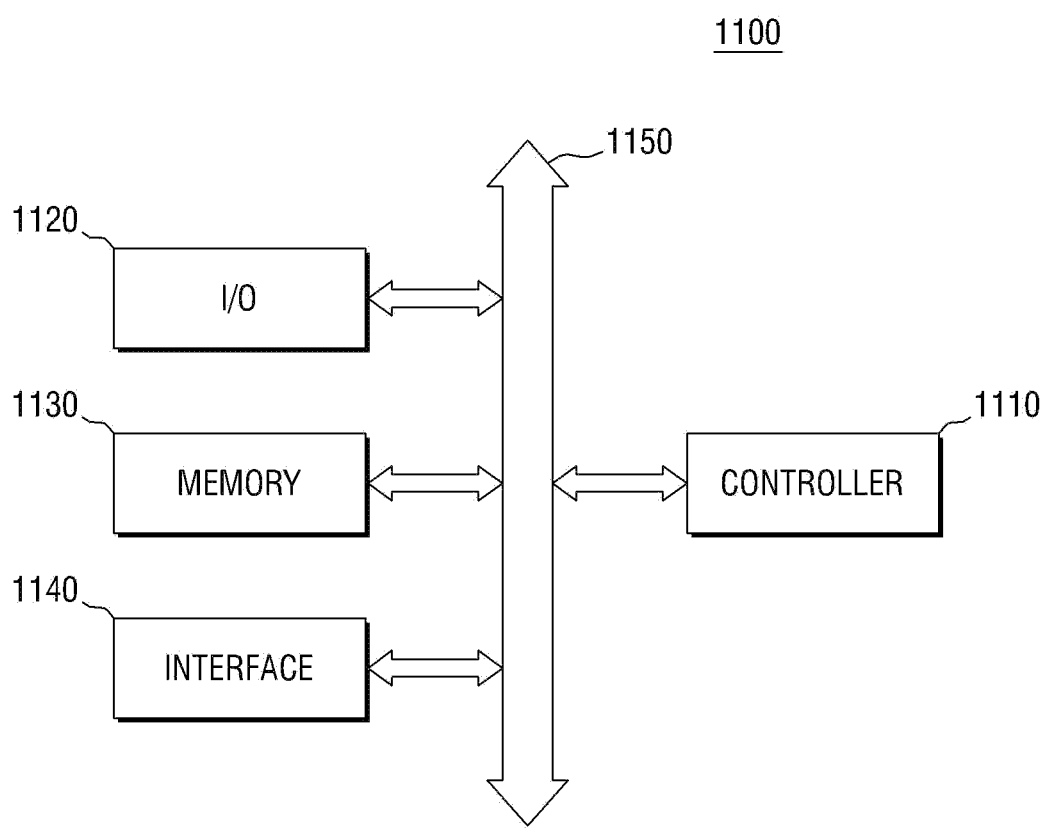
FIG. 21 is a block diagram of an exemplary electronic system including semiconductor devices according to some embodiments.

FIG. 21 is a block diagram of an exemplary electronic system including semiconductor devices according to some embodiments.

Referring to FIG. 21, the electronic system 1100 according to the certain embodiments may include a controller 1110, an input/output device (I/O) 1120, a memory device 1130, an interface 1140 and a bus 1150. The controller 1110, the I/O 1120, the memory device 1130 and/or the interface 1140 may be connected to each other through the bus 1150. The bus 1150 corresponds to a path through which data moves.

The semiconductor devices including the vertical cylindrical electrodes according to the various embodiments described above may be used in at least one of the aforementioned components.

The controller 1110 may include at least one of a microprocessor, a digital signal processor, a microcontroller, and logic elements capable of functions similar to those of these elements. The I/O 1120 may include a keypad, a keyboard, a display device, and so on. The memory device 1130 may store data and/or codes. The interface 1140 may perform functions of transmitting data to a communication network or receiving data from the communication network. The interface 1140 may be wired or wireless. For example, the interface 1140 may include an antenna or a wired/wireless transceiver, and so on. Although not shown, the electronic system 1100 may further include high-speed DRAM and/or SRAM as the working memory for improving the operation of the controller 1110. The semiconductor devices according to the embodiments described above may be incorporated into the memory device 1130 or may be provided a component of the controller 1110 or the I/O 1120. For example, a plurality of capacitors formed by the lower electrodes and the upper electrode according to the examples above may be used to form part of a memory, such as a DRAM or SRAM, or part of a controller.

The electronic system 1100 may be applied, for example, to a personal digital assistant (PDA), a portable computer, a web tablet, a wireless phone, a mobile phone, a digital music player, a memory card, or any other type of electronic device capable of transmitting and/or receiving information in a wireless environment. The electronic system 1100 may also be applied to a device used in a wired environment.

While the present disclosure has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A semiconductor device comprising:
a substrate;
a plurality of lower electrodes formed on the substrate, wherein:
each lower electrode extends vertically upward away from the substrate,
first lower electrodes of the plurality of lower electrodes include a bottom cylinder portion at a first height that has vertical walls on all sides and a top cylinder portion at a second height above the first height that also has vertical walls on all sides, and
second lower electrodes of the plurality of lower electrodes include a bottom cylinder portion at the first height that has vertical walls on all sides and a top cylinder portion at the second height that has vertical walls on at least one side but no walls on at least part of the top cylinder portion;
a dielectric layer formed on the plurality of lower electrodes; and
an upper electrode formed on the plurality of lower electrodes and on the dielectric layer, wherein:
the upper electrode includes a first semiconductor compound layer and a second semiconductor compound layer sequentially stacked one on the other, and the first semiconductor compound layer has a crystallinity different from that of the second semiconductor compound layer,
the first semiconductor compound layer is formed above portions of the second lower electrodes having no walls on at least part of the top cylinder portion and is not formed above the first lower electrodes; and
the first semiconductor compound layer is formed between the second lower electrodes and the second semiconductor compound layer.

2. The semiconductor device of claim 1, wherein:
the upper electrode further comprises a portion that includes a metal and is disposed to contact the dielectric layer.

3. The semiconductor device of claim 1, wherein:
the crystallinity of the first semiconductor compound layer is lower than that of the second semiconductor compound layer.

4. The semiconductor device of claim 1, wherein:
the lower electrodes and the upper electrode form capacitor electrodes in a semiconductor memory device.

5. A semiconductor device comprising:
first storage electrodes and second storage electrodes adjacent to each other and each having a cylinder shape;
a supporter pattern between the first storage electrodes and the second storage electrodes;
a dielectric film on the first storage electrodes and the second storage electrodes;

a recess on a portion of a sidewall of each of the first storage electrodes; and an upper electrode formed on the dielectric film, wherein the upper electrode includes a first semiconductor compound layer formed in the recess and a second semiconductor compound layer formed on the first semiconductor compound layer, and the first semiconductor compound layer and the second semiconductor compound layer have different compositions.

6. The semiconductor device of claim 5, wherein the first semiconductor compound layer and the second semiconductor compound layer include SiGe, and the Si concentration of the first semiconductor compound layer is higher than that of the second semiconductor compound layer.

7. The semiconductor device of claim 5, wherein the crystallinity of the first semiconductor compound layer is lower than that of the second semiconductor compound layer.

8. The semiconductor device of claim 5, wherein the supporter pattern contacts the first storage electrodes and the second storage electrodes.

9. The semiconductor device of claim 8, wherein the dielectric film is conformally formed along top surfaces and sidewalls of the first storage electrodes, a top surface of the supporter pattern and sidewalls and top surfaces of the second storage electrodes.

10. The semiconductor device of claim 9, wherein the upper electrode further includes a metal portion, the metal portion is formed in contact with the dielectric film and fills spaces between the sidewalls of the first storage electrodes and the sidewalls of the second storage electrodes.

11. The semiconductor device of claim 9, wherein a thickness of the dielectric film formed on the top surface of each of the second storage electrodes is greater than that of the dielectric film formed on the sidewalls of the second storage electrodes.

12. A semiconductor device comprising:
a storage electrode having a cylinder shape;
a dielectric film on the storage electrode; and
a plate electrode on the dielectric film,
wherein the plate electrode includes a first semiconductor compound layer and a second semiconductor compound layer sequentially stacked one on the other, and the first semiconductor compound layer has a crystallinity different from that of the second semiconductor compound layer,
wherein a recess is formed on a first sidewall of the storage electrode and a recess is not formed on a second sidewall of the storage electrode, and the first semiconductor compound layer is formed in the recess above the first sidewall and is not formed above the second sidewall.

13. The semiconductor device of claim 12, wherein the crystallinity of the first semiconductor compound layer is lower than that of the second semiconductor compound layer.

14. The semiconductor device of claim 12, wherein the first semiconductor compound layer and the second semiconductor compound layer include a plurality of semiconductor elements, which are the same as each other, the first semiconductor compound layer and the second semiconductor compound layer having different composition ratios of those semiconductor elements.

15. The semiconductor device of claim 12, wherein the first semiconductor compound layer and the second semiconductor compound layer include SiGe, and the first semiconductor compound layer has a higher Si concentration than the second semiconductor compound layer.

16. The semiconductor device of claim 12, wherein the plate electrode further includes a metal film that contacts the dielectric film.

17. The semiconductor device of claim 12, wherein a metal film, a first semiconductor compound layer that contacts the metal film, and a second compound that contacts the first semiconductor compound layer are formed on the first sidewall, and a metal film and a second semiconductor compound layer that contacts the metal film are formed on the second sidewall.

18. The semiconductor device of claim 12, further comprising a supporter pattern formed at the second sidewall.

19. The semiconductor device of claim 5, wherein the first semiconductor compound layer of the upper electrode is not formed on the second storage electrodes.

20. The semiconductor device of claim 12, wherein the second semiconductor compound is formed above the first semiconductor compound formed in the recess, and extends in a direction perpendicular to the direction in which the first and second semiconductor compounds are stacked.

* * * * *